United States Patent
Ham et al.

(10) Patent No.: US 7,091,802 B2
(45) Date of Patent: Aug. 15, 2006

(54) METHODS AND APPARATUS BASED ON COPLANAR STRIPLINES

(75) Inventors: Donhee Ham, Cambridge, MA (US); William Franklin Andress, Lexington, MA (US); Yong Liu, Somerville, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 19 days.

(21) Appl. No.: 10/894,674

(22) Filed: Jul. 19, 2004

(65) Prior Publication Data

US 2005/0068116 A1   Mar. 31, 2005

Related U.S. Application Data

(60) Provisional application No. 60/533,904, filed on Jan. 2, 2004, provisional application No. 60/489,708, filed on Jul. 23, 2003.

(51) Int. Cl.
*H01P 3/08* (2006.01)
*H03B 5/18* (2006.01)

(52) U.S. Cl. .................................. 333/246; 331/99
(58) Field of Classification Search ............... 333/246; 331/96, 99
See application file for complete search history.

(56) References Cited

U.S. PATENT DOCUMENTS

| | | |
|---|---|---|
| 2,735,941 A | 2/1956 | Peck |
| 3,699,475 A | 10/1972 | Rogers |
| 3,745,488 A | 7/1973 | Rogers |
| 4,914,407 A | 4/1990 | Itoh |

(Continued)

FOREIGN PATENT DOCUMENTS

DE   102 15 414 A1 * 10/2003

(Continued)

OTHER PUBLICATIONS

Goverdhanam, Kavita, "Coplanar Stripline Components for High-Frequency Applications," *IEEE Transactions on Microwave Theory and Techniques*, vol. 45, No. 10, Oct. 1997.

(Continued)

*Primary Examiner*—David Mis
(74) *Attorney, Agent, or Firm*—Wolf, Greenfield & Sacks

(57) ABSTRACT

Methods and apparatus for implementing standing wave oscillators (SWOS) using coplanar striplines (CPS). One example is given by a quarter-wavelength ($\lambda/4$) coplanar stripline standing wave oscillator (SWO), while another implementation utilizes a closed-loop coplanar stripline configuration. In various aspects, SWOs are configured to optimize sinusoidal performance at high frequencies with low power dissipation by incorporating various features that dramatically increase the quality factor Q of the oscillator. In particular, in one aspect, an amplitude-dependent tailored distributed amplification scheme is employed as a mode control technique using multiple amplifiers having different gains along the length of the coplanar stripline. In another aspect, a coplanar stripline configured such that its resistance per unit length R and conductance per unit length G are discreet or continuous functions of position along the coplanar stripline is employed to reduce SWO losses. In another aspect, an enhancement of the quality factor Q is achieved while at the same time reducing the phase velocity of waves propagating in the SWO, thereby also facilitating the fabrication of relatively smaller devices. In yet another aspect, SWOs are configured with frequency adjustability that is again optimized to reduce power dissipation while facilitating significant adjustments of oscillator frequency.

48 Claims, 25 Drawing Sheets

U.S. PATENT DOCUMENTS

| | | | |
|---|---|---|---|
| 5,248,949 A * | 9/1993 | Eguchi et al. | 333/204 |
| 5,365,391 A | 11/1994 | Sugiyama et al. | |
| 6,215,451 B1 | 4/2001 | Hadzoglou | |
| 6,342,820 B1 | 1/2002 | Leyten et al. | |
| 6,396,359 B1 | 5/2002 | Hajimiri et al. | |
| 6,853,260 B1 | 2/2005 | Hajimiri et al. | |
| 2002/0149431 A1 | 10/2002 | Hajimiri et al. | |
| 2003/0006851 A1 | 1/2003 | Wood | |

FOREIGN PATENT DOCUMENTS

| | | |
|---|---|---|
| EP | 501478 | 2/1992 |

OTHER PUBLICATIONS

Cheung et al., "On-Chip Interconnect for mm-Wave Applications Using an All-Copper Technology and Wavelength Reduction," 2003 IEEE International Solid-State Circuits Conference, ISSCC 2003/ Session 22 / TD: Embedded Technologies / Paper 22.6.

Chi, "Salphasic Distribution of Clock Signals for Synchronous Systems," *IEEE Transactions on Computer*, May 1994, pp. 597-601, vol. 43, No. 5.

Fukuoka, "Analysis of Slow-Wave Coplanar Waveguide for Monolithic Integrated Circuits," *IEEE Transactions on Microwave Theory and Techniques*, Jul. 1983, pp. 567-573, vol. MTT-31, No. 7.

Fukuoka, "Slow-Wave Coplanar Waveguide on Periodically Doped Semiconductor Substrate," *IEEE Transactions on Microwave Theory and Techniques*, Dec. 1983, pp. 1013-1017, vol. MTT-31, No. 12.

Hasegawa et al., "Properties of Microstrip Line on Si-SiO$_2$ System," *IEEE Microwave Theory Tech.*, Nov. 1971, pp. 367-379, vol. MTT-19, No. 11.

O'Mahony et al., "10GHz clock distribution using coupled standing-wave oscillators", Solid-State Circuits Conference, 2003, Digest of Technical Papers., ISSCC, 2003, IEEE International San Francisco, CA, Feb. 9-13, 2003, Piscataway, NJ. pp. 1-10.

Seki et al., "Cross-tie slow-wave coplanar waveguide on semi-insulating GaAs substrates," Electronics Letters, Dec. 10, 1981, pp. 940-941, vol. 17, No. 26.

Te-Hui Wang et al., "Compact Grating Structure for Application to Filters and Resonators in Monolithic Microwave Integrated Circuits," *IEEE Transactions on Microwave Theory and Techniques*, Dec. 1987, pp. 1176-1182, vol. MTT-35, No. 12.

Te-Hui Wang et al., "Confirmation of Slow Waves in a Crosstie Overlay Coplanar Waveguide and Its Applications to Band-Reject Grating and Reflectors," *IEEE Transactions on Microwave Theory and Techniques*, Dec. 1988, pp. 1811-1818, vol. 36, No. 12.

Wu et al., "Silicon-Based Distributed Voltage-Controlled Oscillators," *IEEE Journal of Solid-State Circuits*, Mar. 2001, pp. 493-502, vol. 36, No. 3.

Yue et al., "On-Chip Spiral Inductors with Patterned Ground Shields for Si-Based RF IC's," *IEEE Journal of Solid-State Circuits*, May 1998, pp. 743-752, vol. 33, No. 5.

* cited by examiner

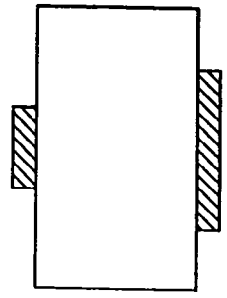
FIG. 1E
(Prior Art)
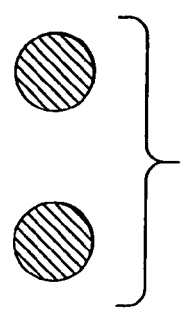
FIG. 1B
(Prior Art)
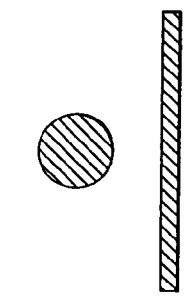
FIG. 1D
(Prior Art)
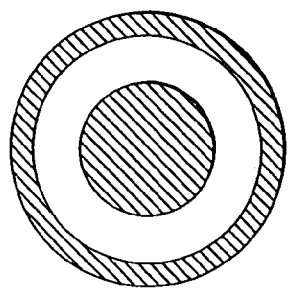
FIG. 1A
(Prior Art)
FIG. 1C
(Prior Art)

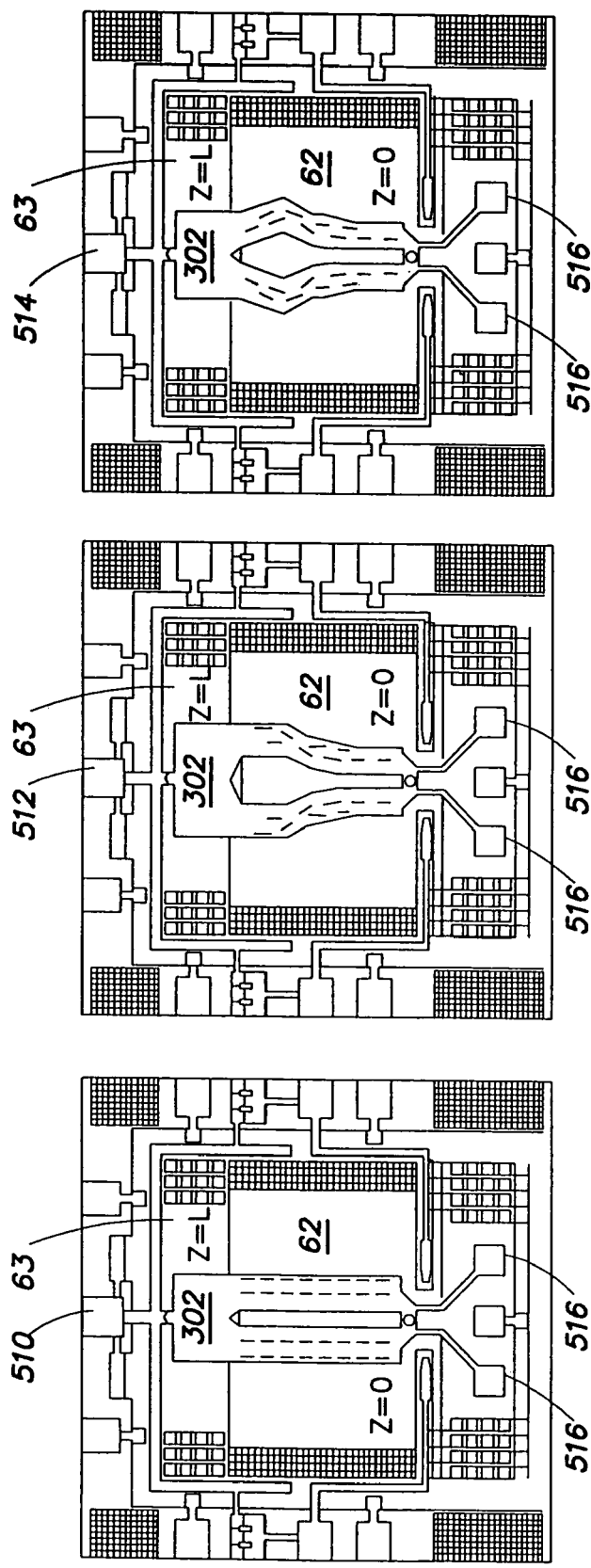

METHODS AND APPARATUS BASED ON COPLANAR STRIPLINES

CROSS-REFERENCES TO RELATED APPLICATIONS

This application claims the benefit under 35 U.S.C. §119 (e) of U.S. Provisional Application Ser. No. 60/489,708, filed Jul. 23, 2003, entitled "Methods and Apparatus for Implementing Standing Wave Sinusoidal Oscillators," and U.S. Provisional Application Ser. No. 60/533,904, filed Jan. 2, 2004, entitled "Methods and Apparatus for Implementing Standing Wave Sinusoidal Oscillators," which applications are hereby incorporated herein by reference.

FIELD OF THE INVENTION

The present invention relates generally to various methods and apparatus involving semiconductor devices based on coplanar striplines (CPS). In some exemplary embodiments, sinusoidal signal sources, and more particularly standing wave sinusoidal oscillators, are implemented based on coplanar stripline configurations.

BACKGROUND

Advanced communications applications that are now a routine part of everyday life, such as cellular telephones, wireless networks, satellite broadcasting and fiber-optic communication, rely on continuing advances in the electronic and related arts in connection with increased speed and reduced size; namely, increasing the speed of information transmission and miniaturizing the integrated circuits that perform various communication-related functions. However, as system designers look forward to using higher frequencies in the range of tens of gigahertz (GHz), as well as the miniaturization of integrated circuits toward an atomic scale, a number of aspects of conventional integrated circuit technology continue to become inapplicable and obsolete. Thus, a common design challenge involves finding new ways to implement well-known circuit building blocks for faster operation, and often in a smaller space. In some instances, such implementations may exploit electromagnetic wave-base concept, and involve a transmission line or waveguide configuration fabricated on a semiconductor substrate.

Transmission line theory is well-established in the art. Generally speaking, a transmission line provides a means by which power or information may be transmitted in a guided manner, for example, to connect a signal source to a load. A transmission line typically includes two parallel conductors separated by a dielectric material. Signals propagate along a given transmission line as electromagnetic waves, and various physical parameters relating to the transmission line, as well as parameters relating to the source of the signal on the line and any loads on the line, affect wave propagation.

FIGS. 1a–1e illustrate typical examples of transmission lines, including a coaxial cable (FIG. 1a), a two-wire line (FIG. 1b), a parallel-plate or planar line (FIG. 1c), a wire above a conducting plane (FIG. 1d), and a microstrip line (FIG. 1e). Again, it is noteworthy that each of these examples consists of two conductors in parallel. Coaxial cables routinely are used in electrical laboratories and in several common consumer applications to interconnect various electrical apparatus (e.g., connecting TV sets to TV antennas or cable feeds). Microstrip lines are particularly important in integrated circuits based on various semiconductor fabrication techniques, where parallel metallic strips fabricated on a dielectric substrate (i.e., separated by a dielectric) connect electronic elements.

Transmission lines often are regarded as special cases of a wider category of "waveguides." A waveguide refers generally to a system that is configured to guide electromagnetic radiation from one point to another. In several common applications, however, a waveguide is more specifically regarded essentially as a bounded conduit through which electromagnetic radiation propagates in a somewhat more confined manner than that generally considered in connection with transmission lines. For example, in the microwave regime, unlike a two-conductor transmission line, a waveguide may be formed as a hollow metallic pipe or tube that may be rectangular, elliptical, or circular in cross-section. In the optical regime, which is not supported at all by transmission lines, waveguides often are formed as a solid dielectric filament (e.g., an optical fiber) or a thin dielectric film bounded by a lower refractive index environment.

As conventionally treated in many applications, transmission lines often may be characterized somewhat differently from a wider category of waveguides in some significant respects. For example, first, a transmission line generally may be configured to operate from DC (frequency f=0) to very high frequencies (e.g., in the millimeter and microwave range, from about 1 GHz to 100 GHz); however, a waveguide can only operate above a certain frequency (a "cutoff frequency") determined by its particular construction and dimensions, and therefore acts generally as a high-pass filter. On the other hand, at significantly high frequencies on the order of approximately 50 GHz to 300 GHz, transmission lines conventionally are regarded as becoming generally inefficient due to the well-known skin effect in the transmission line conductors, as well as dielectric losses involving the material separating the conductors; in contrast, waveguides conventionally are considered in this range of frequencies to obtain larger bandwidth and lower signal attenuation (i.e., a wider range of frequency response with lower signal power loss). However, at the lower end of this frequency range and below, waveguides conventionally are considered to become excessively large in size for some applications, especially integrated circuit applications in which increased miniaturization typically is a goal. Yet another difference between transmission lines and waveguides is that a transmission line can only support a transverse electromagnetic (TEM) wave (i.e., a wave in which both the electric and magnetic field are oriented transversely to the direction of wave propagation), whereas a waveguide generally can support many possible field configurations (i.e. modes).

In semiconductor fabrication of microelectronic circuits, waveguides and transmission lines for carrying high frequency electronic signals conventionally have been implemented in a variety of ways. Two such implementations are referred to respectively as a coplanar waveguide (CPW) and a coplanar stripline (CPS). FIGS. 2A and 2B show different views of a coplanar waveguide, while FIGS. 3A and 3B show different views of a coplanar stripline.

In particular, FIG. 2A illustrates a cross-sectional view of a coplanar waveguide 50 formed by three parallel conductors 20A, 40 and 20B disposed on a dielectric layer 101 on a semiconductor substrate 103. FIG. 2B shows a top view looking down onto an exemplary coplanar waveguide device, in which the center conductor 40 is terminated on each end with pads 42A and 42B, and the conductors 20A and 20B are shown to be electrically connected so as to completely surround the conductor 40 in the plane (the cross-sectional view of FIG. 2A is taken along the dashed lines 2A—2A in FIG. 2B). As illustrated in both FIGS. 2A and 2B, a width $W_1$ of the conductors 20A and 20B may be significantly greater than a width $W_2$ of the center conductor 40.

During normal operation, the conductors 20A and 20B of the coplanar waveguide 50 are electrically connected together to a ground or reference potential, and the signal to be transmitted is applied to the center conductor 40. In this respect, it is particularly noteworthy that the respective ground and signal conductors in a coplanar waveguide are not symmetric, as the combined ground conductors 20A and 20B cover a significantly larger area than the center signal conductor 40. This configuration commonly is referred to as an "unbalanced" configuration. The arrangement of a large ground or reference potential surrounding the center signal conductor 40 serves to confine the electric field in the regions between the center conductor and the ground or reference conductors, thereby creating the "conduit" through which the wave may propagate.

In contrast to a coplanar waveguide, a coplanar stripline is a symmetric or balanced two-conductor device. FIGS. 3A and 3B show different perspectives of one example of an idealized infinite coplanar stripline 100 made up of two substantially identical parallel conductors 100A and 100B separated by a distance S. In particular, FIG. 3A shows a cross-section of the conductors 100A and 100B which, for example, may be metal lines disposed above the dielectric layer 101 on the substrate 103. FIG. 3B shows a top view looking down onto the conductors disposed on the substrate (the cross-sectional view of FIG. 3 is taken along the dashed lines 3A—3A in FIG. 3B).

As can be readily observed in FIGS. 3A and 3B, the geometry of the coplanar stripline 100 is significantly different from that of the coplanar waveguide 50 shown in FIGS. 2A and 2B. In particular, the coplanar waveguide 50 includes three conductors in cross-section, whereas the coplanar stripline 100 includes only two conductors. Moreover, unlike the ground conductors 20A and 20B and the center signal conductor 40 of the coplanar waveguide, which may have respectively different widths, the conductors 100A and 100B of the coplanar stripline have substantially identical widths $W_3$, as indicated in FIGS. 3A and 3B. Again, this arrangement of substantially identical parallel conductors in the coplanar stripline commonly is referred to as a symmetric or "balanced" configuration. Such a symmetric or balanced two-conductor configuration readily supports differential signals on the coplanar stripline, as discussed further below; in contrast, the asymmetric or unbalanced configuration of the coplanar waveguide does not support differential signals, but merely supports "single-ended" signals (i.e., a signal that is referenced to a ground potential).

For many conventional microwave applications, coplanar waveguide implementations generally have been preferable as circuit interconnection structures due to the prevalence of primarily singled-ended or unbalanced microwave devices. Also, coplanar waveguides generally have been regarded as significantly less lossy than coplanar striplines, especially with respect to signal losses to the substrate at microwave frequencies. Hence, historically speaking, much of the relevant literature in connection with high frequency microelectronic devices has focused significantly more on coplanar waveguides rather than on coplanar striplines. Coplanar waveguides generally are regarded as easily integrated with both series and shunt active and passive circuit components. Moreover, the dimensions of coplanar waveguide conductors may be readily varied to match circuit component lead widths and thereby facilitate interconnection with other devices, while maintaining a desired characteristic impedance for the coplanar waveguide that is compatible with the interconnected devices. One tradeoff, however, is that coplanar waveguides take up significant space due to the relatively wide and multiple ground conductors flanking the center signal conductor.

Various characteristics of both coplanar waveguides and coplanar striplines may be modeled at least to some extent using common concepts related to electric circuit theory, such as resistance, inductance, conductance and capacitance. Wave-based structures in general, however, differ from ordinary electric networks in one essential feature: namely, size relative to operating frequency. For example, whereas the physical dimensions of electric networks are very much smaller than the wavelength corresponding to the operating frequency, the size of devices based on waveguides and transmission lines is usually a considerable fraction of the wavelength corresponding to the operating frequency of the device, and may even be many wavelengths long. Accordingly, whereas elements relating to resistance, inductance, conductance and capacitance may be described in common electric circuits as discrete components having lumped parameters, transmission lines and waveguides must instead be described by circuit parameters that are distributed throughout the length of the transmission line/waveguide.

In view of the foregoing, FIGS. 4A and 4B illustrate two different theoretical transmission line/waveguide models involving distributed "line parameters" based on electric circuit concepts. In particular, FIG. 4A shows a "single-ended" model 30 (which may be applied to the coplanar waveguide 50 illustrated in FIGS. 2A and 2B) and FIG. 4B shows a "differential" model 32 (which may be applied to the coplanar stripline 100 illustrated in FIGS. 3A and 3B).

In the models of FIGS. 4A and 4B, the parameter z indicates distance along a length of the transmission line/waveguide in the direction of wave propagation (where dz denotes differential length). The circuit-based line parameters are indicated in FIGS. 4A and 4B as resistance per unit length R, inductance per unit length L, conductance per unit length G, and capacitance per unit length C, wherein R and L are series elements and G and C are shunt elements. In FIG. 4B, the values attributed to the series elements R and L are divided amongst two identical conductors of the model 32 (e.g., Rdz/2 and Ldz/2), to again indicate the "differential" nature of the model.

The line parameters R, L, G and C that may be used to characterize a coplanar waveguide or coplanar stripline directly result from the types of materials used to fabricate the coplanar stripline or coplanar waveguide (e.g., the dielectric, substrate, and metal components) and the various dimensions associated with the coplanar stripline or coplanar waveguide arrangement (e.g., width and thickness of the conductors, space between the conductors, thickness of the dielectric layer, etc.). More specifically, the materials and dimensions involved in a given structure generally determine various physical properties associated with the structure, such as effective permittivity $\epsilon_{eff}$, permeability $\mu$, and various loss factors, on which the line parameters R, L, G and C are based.

Again, as illustrated in FIGS. 4A and 4B, it should be appreciated that the line parameters R, L, G and C are not discrete or lumped but uniformly distributed along the entire length of the coplanar stripline or coplanar waveguide. Also, it should be appreciated that R is the AC resistance per unit length of the conductors (i.e., "series" resistance), whereas G is the conductance per unit length due to the dielectric medium separating the conductors from each other and the substrate (i.e., "shunt" resistance).

The distributed resistance, conductance, inductance and capacitance of the coplanar stripline or coplanar waveguide naturally result in particular frequency characteristics of a given implementation. For example, the general energy storage functions of both inductance and capacitance have a frequency dependence based on any resistance/conductance associated with the inductance/capacitance. One common parameter for characterizing the frequency response of a frequency dependent system, including a given transmission line (or waveguide) configuration, is referred to as a "quality factor," typically denoted in the literature as Q.

The quality factor Q of a frequency dependent system generally is defined as a ratio of a peak or resonant frequency of the system to the frequency bandwidth of the system (i.e., the frequency range between the half-power points of the overall frequency response of the system). The quality factor Q alternatively may be viewed as a ratio of the maximum energy stored in the system to the total energy lost by the system in a given time period. In view of the foregoing, systems with a relatively large Q generally are viewed as being "frequency selective," in that they support frequencies close to a given resonant frequency with relatively little energy loss. In contrast, systems with a relatively smaller Q do not necessarily have a significant frequency preference and are often viewed as somewhat lossy systems.

The quality factor Q of a given coplanar waveguide or coplanar stripline arrangement also may be expressed in terms of various parameters associated with the propagation of a wave along the coplanar waveguide or coplanar stripline. With reference again to the coplanar stripline 100 shown in FIG. 3B, an exemplary position-dependent voltage V(z) is indicated between the conductors and an exemplary position-dependent current I(z) is shown flowing through the conductors, where z indicates distance along the direction of wave propagation. The voltage V(z) as a function of position z along the coplanar stripline may be expressed as:

$$V(z)=V_o e^{-\alpha z} \cos(2\pi ft-\beta z),$$

where $V_o$ is the amplitude of the wave, and the quantity $(2\pi ft-\beta z)$ represents the phase (in radians) of the wave, which depends on both time t and space z. Of course, f is the frequency of the wave, and $\beta$ is the "phase constant" of the wave, defined as $\beta=2\pi/\lambda$; essentially, the phase constant $\beta$ indicates that for every wavelength of distance traveled, a wave undergoes a phase change of $2\pi$ radians. Finally, $\alpha$ is an attenuation factor representing losses as the wave propagates, which affect the overall amplitude of the wave; namely, as $\alpha$ increases, indicating greater loss, the amplitude $V_o$ of the wave accordingly is decreased by the factor $e^{-\alpha z}$. As mentioned above, the quality factor Q also may be expressed in terms of the phase constant $\beta$ and the attenuation factor $\alpha$ and approximated as $Q \approx \beta/2\alpha$ for relatively low loss frequency dependent systems.

Another important characterizing parameter of transmission lines and waveguides relates to the speed with which waves propagate along the transmission line or waveguide. In particular, the phase velocity of a transmission line or waveguide, commonly denoted as v, provides the relationship between the frequency f and wavelength $\lambda$ of a wave in a given medium, according to v=f$\lambda$, and represents the speed of wave propagation in the medium. Accordingly, for a given frequency f, a smaller phase velocity v results in a shorter wavelength $\lambda$. The phase velocity v results from the particular physical characteristics of the device, such as effective permittivity $\epsilon_{eff}$ and permeability $\mu$. With respect to the models illustrated in FIGS. 4A and 4B, the phase velocity may be expressed in terms of the inductance per unit length L and the capacitance per unit length C as $v=1/\sqrt{LC}$.

Since reduction in circuit size generally is a significant goal of improved microelectronic device fabrication techniques, there has been focus in the literature in connection with size reduction of microwave devices based on features that facilitate a reduction in phase velocity. Again, a reduction in phase velocity results in a corresponding reduction in wavelength at a given operating frequency. Devices such as resonators, oscillators, impedance matching networks, signal splitters and combiners, filters, amplifiers and delays may be implemented based on transmission line or waveguide configurations. Often, as mentioned above, the size of such devices is comparable with the wavelength $\lambda$ given a desired range of operating frequencies. Accordingly, by lowering the phase velocity v, smaller devices may be realized.

With this in mind, various "slow-wave" structures in the microwave field have been investigated since the 1970s. Again, many of these studies relate to monolithic microwave integrated circuits (MMICs) involving coplanar waveguides that incorporate features designed to decrease the phase velocity and wavelength, and hence device size, at a given operating frequency or range of frequencies. One such feature for realizing slow-wave structures includes a "periodically loaded" coplanar waveguide, in which floating metal strips are placed periodically beneath the three coplanar waveguide conductors and oriented transversely to the conductors. The presence of the floating metal strips generally is considered to spatially separate the electric and magnetic energy in the propagating wave, which results in an increased capacitance per unit length C of the coplanar waveguide. According to the relationship $v=1/\sqrt{LC}$, such an increased capacitance per unit length C results in a smaller phase velocity v, and hence a smaller wavelength $\lambda$ at a given frequency f. Thus, the presence of these slow-wave features may facilitate fabrication of smaller devices.

In conventional slow-wave microwave structures based on coplanar waveguides, a reduction in wavelength $\lambda$ results in a corresponding increase in the phase constant $\beta$, pursuant to the relationship $\beta=2\pi/\lambda$. However, the effect of increased phase constant $\beta$ on the quality factor Q, according to the relationship $Q \approx \beta/2\alpha$, is not entirely clear from the literature; while an increase in Q might be expected from an increase in $\beta$, the effect of the slow-wave features on the loss $\alpha$ of the coplanar waveguide is unclear. In some reports, it has been suggested that the Q of a coplanar waveguide slow-wave structure incorporating floating metal strips actually may decrease from that of a coplanar waveguide without the slow-wave features, due to increased loss $\alpha$ resulting from the presence of the slow-wave features. Thus, it appears that there may be a tradeoff between quality factor and phase velocity in some coplanar waveguide slow-wave structures; namely, that while phase velocity may be reduced to facilitate implementation of smaller devices, greater losses may result, thereby degrading the quality factor Q of the device.

SUMMARY

The present disclosure relates generally to various methods and apparatus involving semiconductor devices based on coplanar striplines (CPS).

Although coplanar waveguides (CPW) have perhaps received greater attention in the past in areas such as microwave circuit devices and structures, Applicants have recognized and appreciated that various coplanar stripline (CPS) configurations may facilitate fabrication of several useful high-speed microelectronic devices for a wide variety of applications.

Several differences between coplanar waveguides and coplanar striplines have been discussed above in connection with FIGS. 2A, 2B, 3A and 3B. For example, coplanar striplines are two conductor arrangements in cross-section, whereas coplanar waveguides are three conductor arrangements in cross-section, typically requiring significantly more space than coplanar striplines. The two-conductor arrangement of a coplanar stripline is a "balanced" configuration due to the symmetry of the conductors; in contrast, coplanar waveguides are "unbalanced" configurations due to the significant asymmetry amongst the three waveguide conductors (i.e., two wide conductors and one narrow conductor).

For many circuit applications, perhaps one of the most significant differences between coplanar striplines and coplanar waveguides is that, due primarily to their balanced configuration, coplanar striplines can support a differential signal, whereas a coplanar waveguide cannot.

Differential signals are important in applications where signals may be prone to contamination by "pickup" and other miscellaneous noise. For example, a signal transferred over relatively long distances, and/or in environments where several signals or other radiation may be present, may be subject to undesirable distortion that corrupts the integrity of the signal. By transporting a signal in a differential manner using two conductors, any noise that is commonly picked up along both of the conductors may be cancelled out as the differential signal is recovered (by observing the difference between the respective signals on the two conductors); specifically, the common-mode noise on the conductors is "rejected" by subtracting the signal on one conductor from the signal on the other conductor, preferably leaving only the differential signal. This concept commonly is referred to as "common-mode rejection."

The ability of a coplanar stripline to readily support differential signals and thereby facilitate common-mode rejection of undesirable noise may be clearly observed with reference again to FIGS. 3A and 3B. In particular, in the coplanar stripline 100 shown in these figures, neither of the two virtually identical conductors 100A and 100B needs to be at a signal ground or other reference potential; rather, both of the coplanar stripline conductors may respectively and simultaneously carry different signals that are each referenced to ground or some other potential. Furthermore, because the conductors are virtually identical and proximate to each other, they respond essentially identically to their environment in terms of noise pickup.

In contrast, a coplanar waveguide (as illustrated in FIGS. 2A and 2B) only supports a "single-sided" electrical signal, namely, a signal that is referenced to a ground potential. Furthermore, the coplanar waveguide inherently is unbalanced based on the typically larger size of its combined ground conductors compared to its signal conductor. Hence, the conductors of a coplanar waveguide respond differently to their environment in terms of noise pickup. Accordingly, a coplanar waveguide does not readily support a differential signal, and devices based on coplanar waveguides may not take advantage of the noise reduction capability provided by coplanar striplines. Of course, a coplanar stripline also may be configured such that one of its two conductors is at a ground or some other reference potential; however, the capability of a coplanar stripline to support a differential signal makes a coplanar stripline configuration significantly more desirable than a coplanar waveguide configuration for many circuit applications.

In view of the foregoing, several embodiments disclosed below relate to coplanar stripline configurations incorporating various features to facilitate the implementation of a number of different microelectronic devices. Examples of devices that may incorporate various coplanar stripline configurations according to the present disclosure include, but are not limited to, impedance matching devices, devices for power combining and division, delays, resonators, oscillators, filters, amplifiers, mixers and the like, including CMOS-based implementations of such devices. In some exemplary embodiments, sinusoidal signal sources, and more particularly standing wave sinusoidal oscillators, are implemented based on various coplanar stripline configurations according to the present disclosure.

Some embodiments discussed further below relate to various features of coplanar stripline implementations that dramatically increase the quality factor Q of the resulting device. For example, in various aspects of such embodiments, an enhancement of the quality factor Q on the order of 20 or higher may be realized for coplanar stripline devices fabricated on silicon substrates, as well as other substrates. Such an enhancement significantly and favorably contributes to improved performance of various circuit devices based on such implementations (e.g., resonators, oscillators). In one embodiment, an enhancement of the quality factor Q is achieved while at the same time reducing the phase velocity of one or more waves propagating in the device, thereby also facilitating the fabrication of smaller devices. In yet another embodiment, a tapered coplanar stripline configuration results in position-dependent line parameters, which may be exploited to achieve significantly high-Q devices.

For example, one embodiment of the present invention is directed to an apparatus, comprising a coplanar stripline (CPS) including only a first conductor and a second conductor essentially parallel to each other and oriented substantially along a first direction. The apparatus of this embodiment further comprises a plurality of linear conductive strips disposed in proximity to the coplanar stripline. The plurality of linear conductive strips are essentially parallel to each other and oriented substantially along a second direction transverse to the first direction. In one aspect of this embodiment, the apparatus further comprises a silicon substrate on which the at least one dielectric material, the plurality of linear conductive strips, and the coplanar stripline are disposed. In another aspect, the apparatus is configured to support at least one signal on the coplanar stripline having a frequency in a range of from approximately 1 Gigahertz to 60 Gigahertz or higher. In yet another aspect, the coplanar stripline and the plurality of linear conductive strips are arranged such that the apparatus has a quality factor Q of at least 30 for at least one frequency in the range of from approximately 1 Gigahertz to 60 Gigahertz.

Another embodiment of the invention is directed to a method of transporting at least one differential signal, comprising an act of transporting the at least one differential signal over a coplanar stripline oriented substantially along a first direction and disposed in proximity to a plurality of linear conductive strips, wherein the plurality of linear conductive strips are essentially parallel to each other and oriented substantially along a second direction transverse to the first direction.

Yet another embodiment of the present invention is directed to a coplanar stripline configured such that the resistance per unit length R and the conductance per unit length G are discreet or continuous functions of position along the coplanar stripline. In one aspect of this embodiment, a tapered coplanar stripline configuration is implemented wherein a space between the coplanar stripline conductors and a width of the conductors themselves is varied along a length of the coplanar stripline. In one aspect of this embodiment, such a tapered configuration effectively changes the line parameters R and G along the length of the coplanar stripline while substantially maintaining a uniform characteristic impedance of the coplanar stripline, so as to avoid local reflections.

Another embodiment of the present invention is directed to an apparatus, comprising a tapered coplanar stripline including a first conductor and a second conductor, wherein the first and second conductors are oriented substantially along a first direction, and wherein a space between the first and second conductors and a width of the first and second conductors is varied along a length of the coplanar stripline. The apparatus of this embodiment further comprises a plurality of linear conductive strips disposed in proximity to the tapered coplanar stripline. The plurality of linear conductive strips are essentially parallel to each other and oriented substantially along a second direction transverse to the first direction.

Other embodiments of the present invention are directed generally to various methods and apparatus for implementing standing wave sinusoidal oscillators based on coplanar striplines.

For example, one embodiment of the invention is directed to a quarter-wavelength ($\lambda/4$) coplanar stripline standing wave oscillator (SWO) configured to generate at least one voltage standing wave having a frequency $f_o$. The SWO of this embodiment comprises a coplanar stripline including two conductors and having a length L equal to or approximately equal to a quarter-wavelength ($\lambda/4$), wherein $\lambda$ is related to the frequency $f_o$ by a phase velocity of waves constituting the at least one voltage standing wave. The SWO further comprises at least one amplifier disposed between the conductors at a first end of the coplanar stripline, wherein the two conductors are connected together at a second end of the coplanar stripline to form a short circuit.

In one aspect of this embodiment, the SWO is configured to optimize sinusoidal performance at high frequencies with low power dissipation by employing mode control techniques. In particular, in one aspect of this embodiment, the SWO is configured as an essentially single mode device using a tailored distributed amplification scheme employing multiple amplifiers having different gains along the length of the coplanar stripline. In yet another aspect of this embodiment, the different gains of the amplifiers are "amplitude-dependent" in that they are based at least in part on the expected amplitudes of the desired mode at the respective positions of the amplifiers along the coplanar stripline.

More generally, one embodiment of the invention is directed to a method for generating at least one voltage standing wave on a coplanar stripline, comprising an act of distributing amplification in a varying manner along the coplanar stripline so as to overcome coplanar stripline loss. Another embodiment of the invention is directed to a method for generating at least one voltage standing wave on a coplanar stripline, comprising an act of controlling an oscillation mode of the at least one voltage standing wave. In various aspects of these embodiments, amplitude-dependent distributed amplification may be employed to facilitate low loss single mode operation.

Another embodiment of the invention is directed to an SWO employing a coplanar stripline configuration comprising a plurality of linear conductive strips disposed in proximity to the coplanar stripline. The plurality of linear conductive strips are essentially parallel to each other and oriented substantially along a second direction transverse to the first direction. In one aspect of this embodiment, the coplanar stripline conductors and the plurality of linear conductive strips are arranged with respect to each other so as to realize a quality factor enhancement and a phase velocity reduction of components of a voltage standing wave on the coplanar stripline conductors.

Another embodiment of the invention is directed to an SWO employing a tapered coplanar stripline configuration so as to significantly reduce power consumption by the SWO. In one aspect of this embodiment, the SWO is configured such that a coplanar stripline region of low conductance per unit length (low G) is positioned at or near points where maximum voltage amplitudes are expected, so as to reduce power dissipation to the substrate. Additionally, in another aspect, a coplanar stripline region of low resistance per unit length (low R) is positioned at or near points where maximum currents are expected, so as to reduce power dissipation from the transmission line itself (i.e., series losses).

Another embodiment of the invention is directed to a coplanar stripline SWO employing one or more of a tailored distributed amplification scheme, a plurality of linear conductive strips disposed in proximity to the coplanar stripline, and a tapered coplanar stripline configuration so as to implement mode control and reduce overall power dissipation of the oscillator.

In yet another embodiment, an SWO is configured with frequency adjustability that is again optimized to reduce power dissipation while facilitating significant adjustments of oscillator frequency. For example, one embodiment of the invention is directed to a method for controlling a frequency of at least one voltage standing wave on a coplanar stripline, comprising an act of placing at least one frequency control device along the coplanar stripline at a position that is approximately at a midpoint between a maximum amplitude of the at least one voltage standing wave and a zero voltage node of the at least one voltage standing wave.

Another embodiment of the invention is directed to a closed loop (e.g., circular) SWO based on a ring resonator coplanar stripline implementation. In particular, the SWO of this embodiment comprises a closed-loop coplanar stripline including two conductors, and at least one amplifier disposed between the two conductors at a first location. The two conductors are connected together at a second location different from the first location to provide a zero voltage node for the at least one voltage standing wave. In various aspects of this embodiment, one or more of a tailored distributed amplification scheme, a plurality of linear conductive strips disposed in proximity to the coplanar stripline, and a tapered coplanar stripline configuration may be used with the closed loop structure. In another aspect, a particular amplifier configuration involving cross-coupling of the coplanar stripline conductors is employed to facilitate single mode operation, using a particular resonator topology so as to avoid inducing significant loss in the oscillator.

It should be appreciated that all combinations of the foregoing concepts and additional concepts discussed in greater detail below are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1 illustrates various examples of conventional transmission lines;

FIGS. 18A, 18B and 18C illustrate photographs of three different ($\lambda$/4) coplanar stripline standing wave oscillator designs according to various embodiments of the present invention;

DETAILED DESCRIPTION

As discussed above in the Summary, various embodiments of the present disclosure are directed to methods and apparatus involving semiconductor devices based on coplanar striplines (CPS). Applicants have recognized and appreciated that a variety of coplanar stripline configurations may form the basis of several useful high-speed microelectronic devices for a host of applications. Examples of CPS-based devices incorporating various concepts according to the present disclosure include, but are not limited to, impedance matching devices, devices for power combining and division, delays, resonators, oscillators, filters, amplifiers, mixers and the like, including CMOS-based implementations of such devices.

In general, high-speed microelectronic devices based on coplanar stripline implementations according to various embodiments of the present invention may support differential signals in a range of approximately from 1 Gigahertz to approximately 100 Gigahertz, although it should be appreciated that the present disclosure is not limited in these respects. For example, in some implementations based on the concepts disclosed herein, devices may be configured for operation in a variety of frequency ranges to support either single-ended or differential signals.

In the embodiments discussed further below, CPS-based devices may incorporate various features that dramatically increase the quality factor Q of the resulting device. Additionally, an enhancement of the quality factor Q may be achieved while at the same time reducing the phase velocity of one or more waves propagating in the device, thereby also facilitating the fabrication of relatively smaller devices.

In the section following immediately below, embodiments relating to different coplanar stripline configurations according to the present disclosure that may be generally employed in a variety of devices are presented first. Later sections of this disclosure provide some specific examples of devices based on various coplanar stripline configurations, including particular examples of standing wave oscillators (SWOs). It should be appreciated that the examples discussed herein are provided primarily for the purpose of illustrating some salient concepts underlying the present disclosure, and that the invention is not limited to any particular manner of implementation or any particular example discussed herein.

I. Coplanar Striplines with Floating Conductor Arrays

Figure 5A:
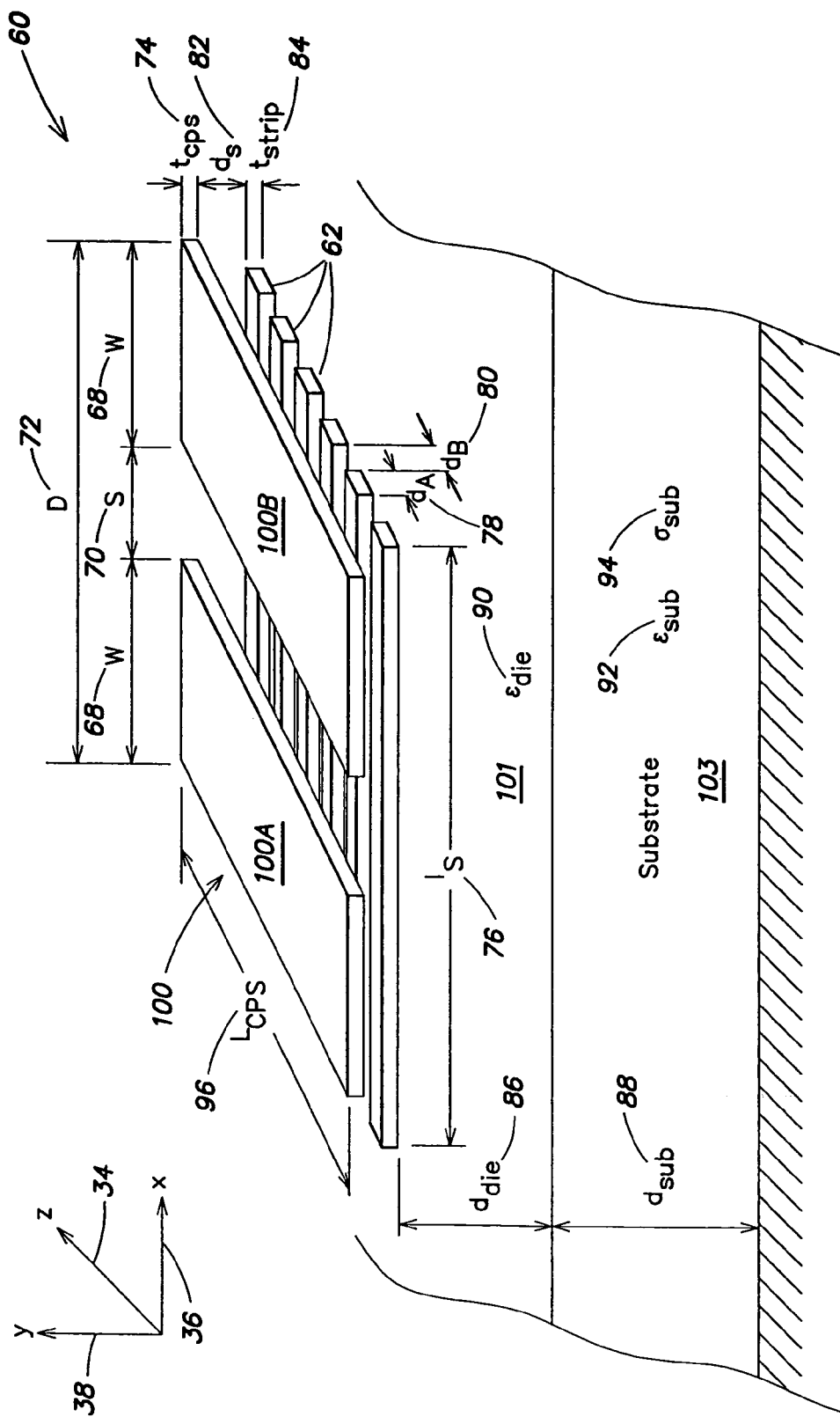
FIGS. 5A and 5B are perspective and cross-sectional views, respectively, illustrating an example of an apparatus based on a coplanar stripline configuration, according to one embodiment of the invention.
Figure 5B:
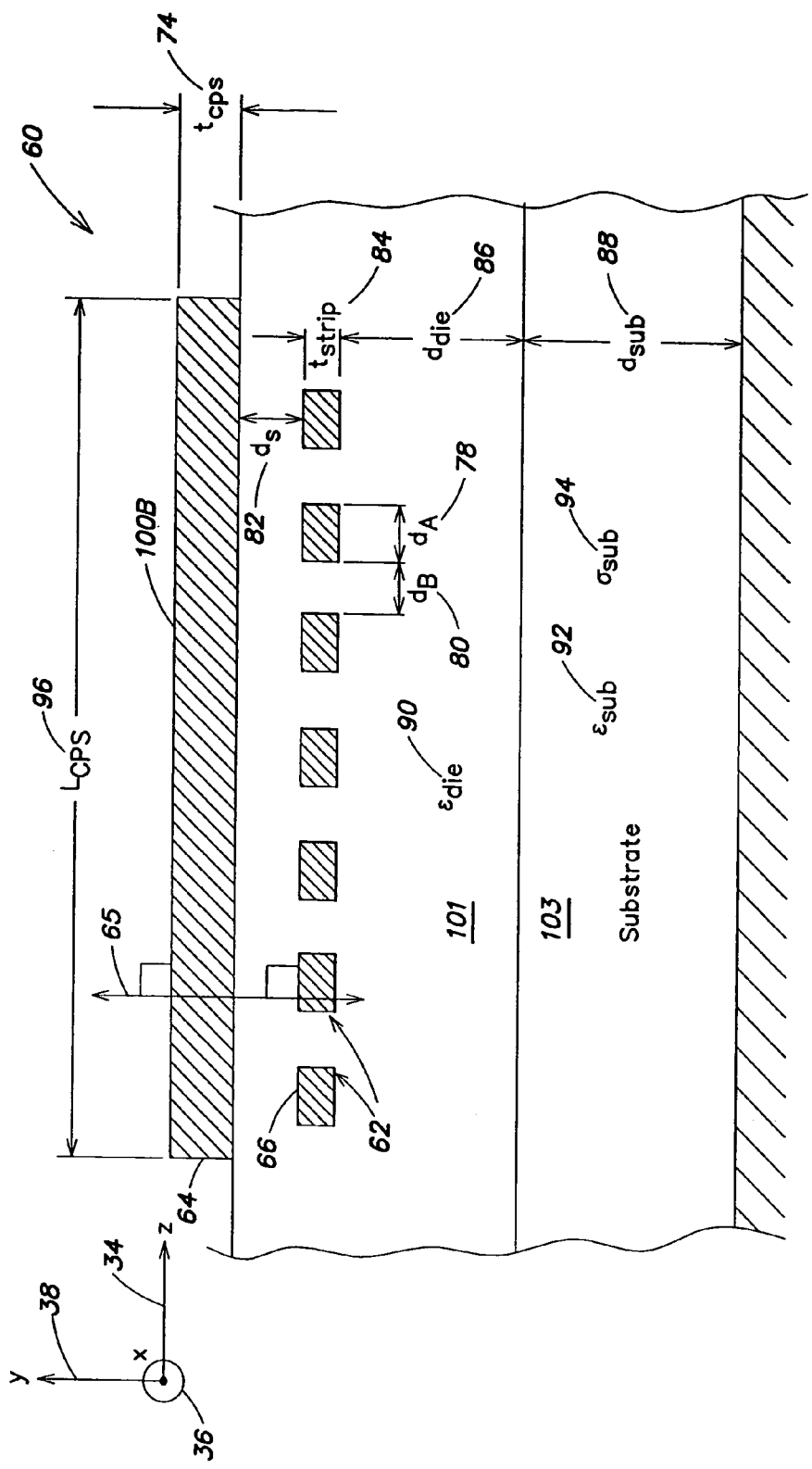

FIGS. 5A and 5B are perspective and cross-sectional views, respectively, illustrating an example of an apparatus 60 based on a coplanar stripline configuration, according to one embodiment of the invention. In the top left corner of FIG. 5A, a coordinate system including an x-axis 36, a y-axis 38 and a z-axis 34 provides a general orientation for the perspective view of the apparatus 60; similarly, in FIG. 5B, the y-axis 38 and z-axis 34 in the top left corner indicate that the cross-sectional view is along a direction parallel to the x-axis 36.

As shown in FIG. 5A, the apparatus includes a coplanar stripline 100 having a first conductor 100A and a second conductor 100B essentially parallel to each other and oriented substantially along a first direction parallel to the z-axis 34. The apparatus 60 also includes an array 62 of essentially linear conductive strips disposed in proximity to the coplanar stripline 100. The linear conductive strips constituting the array 62 are essentially parallel to each other, and the array 62 is oriented substantially along a second direction transverse to the first direction. In one aspect of this embodiment, as illustrated in FIG. 5A, the second direction may be essentially parallel to the x-axis 36, namely, orthogonal to the first direction along which the coplanar stripline 100 is oriented. It should be appreciated that the number of conductive strips depicted in the array shown in FIGS. 5A and 5B is primarily for purposes of illustration, and that the invention is not limited to any particular number of conductive strips in the array 62.

As also shown in both FIGS. 5A and 5B, the apparatus 60 further includes at least one dielectric material 101 disposed at least between the coplanar stripline 100 and the array 62 of conductive strips, and a substrate 103 on which the dielectric material, the array of conductive strips and the coplanar stripline are disposed. In one aspect of this embodiment, the dielectric material 101 may be silicon oxide, although the invention is not limited in this respect as other dielectric materials may be employed in various implementations. In another aspect of this embodiment, the substrate 103 may be is silicon; however, again, the invention is not limited in this respect as other substrates (e.g., GaAs, SiGe, etc.) may be employed in various implementations. With reference to FIG. 5B, it may be seen that according to another aspect of this embodiment, the coplanar stripline 100 (of which only the conductor 100B is visible in the view of FIG. 5B) is disposed in a first plane 64, and the array 62 of linear conductive strips is disposed in a second plane 66 essentially parallel to the first plane 64, such that a normal 65 to both the first plane and the second plane passes through both of one conductor of the coplanar stripline and at least one conductive strip of the array 62.

According to other aspects of the apparatus 60 of the embodiment shown in FIGS. 5A and 5B, the apparatus is configured generally to support at least one signal on the coplanar stripline having a frequency in a range of from approximately 1 Gigahertz (GHz) to approximately 100 GHz. More specifically, the apparatus may be configured to support a signal on the coplanar stripline having a frequency in a range of from approximately 10 GHz to 60 GHz. In various implementations, differential signals (or single-ended signals) may be transported along the conductors 100A and 100B of the coplanar stripline while the array of linear conductive strips is maintained at a floating electric potential with respect to the conductors 100A and 100B. As discussed further below, the proximity of the floating conductor array 62 to the coplanar stripline 100 results in a dramatic increase in the quality factor Q of the apparatus, relative to that generally observed in a conventional coplanar stripline without the array 62 (e.g., refer to FIGS. 3A and 3B).

For example, in one aspect of the embodiment of FIGS. 5A and 5B, the coplanar stripline 100 and the array 62 of linear conductive strips are arranged such that the apparatus has a quality factor Q of at least 30 for at least one frequency in the range of from approximately 1 GHz to at least 60 GHz. In another aspect, the coplanar stripline and the array of linear conductive strips are arranged such that the apparatus has a quality factor Q of at least 50 for at least one frequency in the range of from approximately 1 GHz to at least 60 GHz. In yet another aspect, the coplanar stripline and the array of linear conductive strips are arranged such that the apparatus has a quality factor Q of at least 70 for at least one frequency in the range of from approximately 1 GHz to at least 60 GHz. As discussed further below, the foregoing characteristics are achieved at least in part via the selection of particular dimensions of the various components of the apparatus, particular spacings between the components, and the types of materials employed in the apparatus.

According to yet another aspect of this embodiment, the presence of the floating conductor array 62 in the apparatus 60 of FIGS. 5A and 5B may also result in a reduction of the phase velocity of one or more waves propagating in the device, thereby also facilitating the fabrication of relatively smaller devices. This "slow-wave" effect of the floating conductor array is known in connection with other structures, in which a periodic loading of a waveguide or transmission line by such floating conductors generally is considered to spatially separate the electric and magnetic energy in the propagating wave(s). Such a separation of electric and magnetic energy results in an increased capacitance per unit length C of the structure. According to the relationship $v=1/\sqrt{LC}$, such an increased capacitance per unit length C in turn results in a smaller phase velocity v, and hence a smaller wavelength $\lambda$ at a given signal frequency f.

To facilitate a discussion of both Q-enhancement and phase velocity reduction effects in the apparatus 60, a number of dimensions for various components and spacings between components are indicated in FIGS. 5A and 5B, as well as some physical characteristics (e.g., permittivity $\epsilon$ and conductivity $\sigma$) for materials employed in the apparatus.

For example, with respect to the coplanar stripline 100, a width 68 of each of the first and second conductors 100A and 100B along a direction parallel to the x-axis 36 is indicated in FIG. 5A with the notation W. Similarly, a space 70 or distance between the first and second conductors is indicated with the notation S. Accordingly, a dimension 72 for the overall width of the coplanar stripline 100 is indicated in FIG. 5A with the notation D, wherein D=2W+S. A thickness 74 for each of the conductors 100A and 100B, along a direction parallel to they-axis 38, is indicated in both FIGS. 5A and 5B with the notation $t_{cps}$. Finally, an overall length 96 of the coplanar stripline 100 along a direction parallel to the z-axis 34 in the apparatus 60 is indicated in both FIGS. 5A and 5B with the notation $L_{CPS}$.

With respect to the array 62 of linear conductive strips, a length 76 of each strip, along a direction parallel to the x-axis 36, is denoted in FIG. 5A with the notation $l_s$. Similarly, a width 78 of each strip along a direction parallel to the z-axis 34, shown in both FIGS. 5A and 5B, is denoted as $d_A$, whereas a space 80 along this direction, between neighboring strips of the array (also shown in both FIGS. 5A and 5B), is denoted as $d_B$. A thickness 84 along a direction parallel to the y-axis for each of the strips of the array 62 is denoted in both FIGS. 5A and 5B as $t_{strip}$, whereas a distance 82 along this direction between the first plane 64 (in which lies the coplanar stripline 100) and the second plane 66 (in which lies the array 62) is denoted as $d_S$.

With respect to the dielectric material 101 and the substrate 103 of the apparatus 60 shown in FIGS. 5A and 5B, a dielectric thickness or distance 86 along a direction parallel to the y-axis, between the second plane 66 and an upper boundary of the substrate 103, is denoted in both FIGS. 5A and 5B by $d_{die}$, and a permittivity 90 of the dielectric material is denoted by $\epsilon_{die}$. Similarly, a substrate thickness or distance 88 along a direction parallel to the y-axis is denoted as $d_{sub}$, a permittivity 92 of the substrate is denoted as $\epsilon_{sub}$, and a conductivity 94 of the substrate is denoted as $\sigma_{sub}$.

In general, as discussed above, Applicants have recognized and appreciated that the selection of particular dimensions of the various components of the apparatus 60, particular spacings between the components, and the types of materials employed in the apparatus not only determine the range of frequencies for which the apparatus is capable of effectively carrying signals, but also determine the degree of Q-enhancement and phase velocity reduction realized in the apparatus. In particular, through both simulation and empirical processes, a number of useful generalizations have been established regarding the overall configuration of the apparatus 60 and, more specifically, the length $l_s$, width $d_A$ and spacing $d_B$ of the conductive strips of the array 62, with respect to one or both of Q-enhancement and phase velocity reduction.

For example, according to one aspect of the embodiment of FIGS. 5A and 5B, in general, favorable conditions for significant Q-enhancement may include configurations in which the length $l_s$ of the conductive strips of the array 62 and the overall width D of the coplanar stripline 100 are approximately equal. More specifically, in one aspect, dramatic Q-enhancement may be observed in structures in which the length $l_s$ of the conductive strips is slightly greater (e.g., up to approximately 10% greater) than the overall width D of the coplanar stripline.

In other aspects, favorable conditions for significant Q-enhancement also may include configurations in which at least one of the width $d_A$ of each conductive strip and the space $d_B$ between neighboring conductive strips is significantly less than the overall width D of the coplanar stripline. More specifically, favorable Q-enhancement configurations may include those in which one or more of the following conditions is found: the width $d_A$ and the space $d_B$ are at least one order of magnitude less than the overall width D of the coplanar stripline; the width $d_A$ of the conductive lines and the space $d_B$ between conductive lines are approximately one order of magnitude less than the overall width D of the coplanar stripline; and the width $d_A$ and the space $d_B$ are approximately equal.

According to yet other aspects, favorable Q-enhancement configurations may include those in which one or more of the following conditions is found: at least one of the width $d_A$ of each conductive strip and the space $d_B$ between neighboring conductive strips is significantly less than the overall length $L_{CPS}$ of the coplanar stripline; the width $d_A$ and the space $d_B$ are at least one order of magnitude less than the overall length $L_{CPS}$ of the coplanar stripline; the width $d_A$ of the conductive lines and the space $d_B$ between conductive lines are approximately one order of magnitude less than the overall length $L_{CPS}$ of the coplanar stripline; and the width $d_A$ and the space $d_B$ are approximately equal.

Figure 6A:
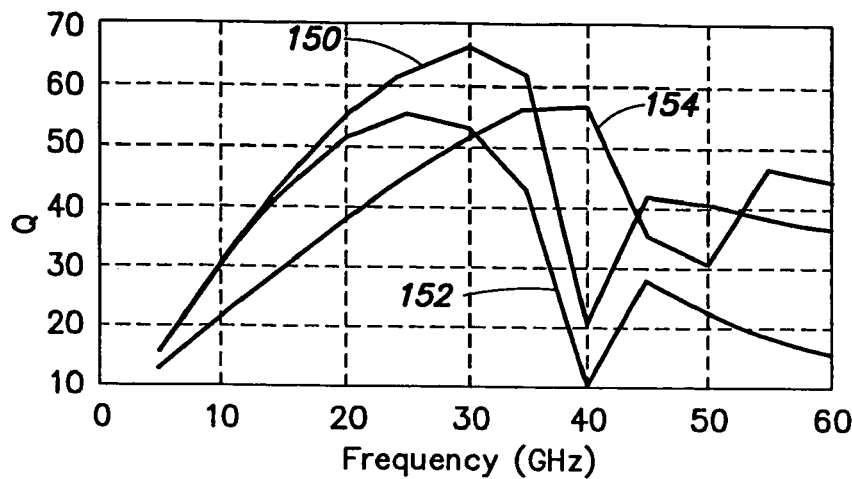
FIGS. 6A, 6B and 6C are three graphs illustrating a simulated quality factor Q vs. signal frequency for different configurations of the apparatus of FIGS. 5A and 5B, according to various embodiments of the invention.
Figure 6B:
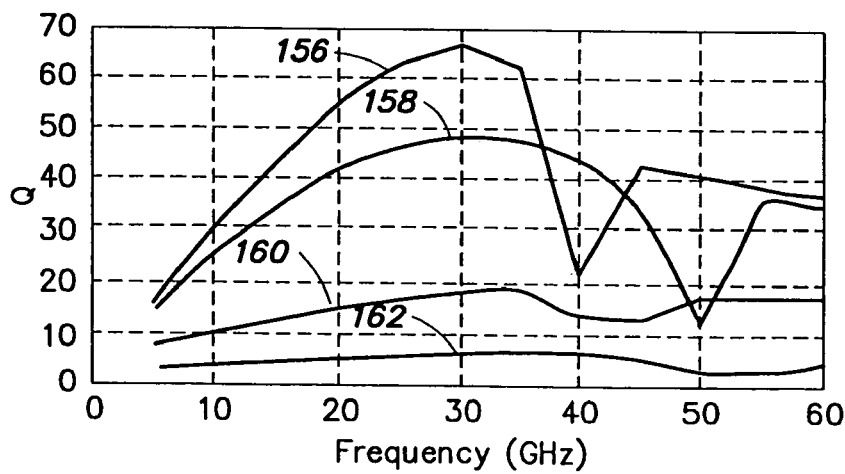
Figure 6C:
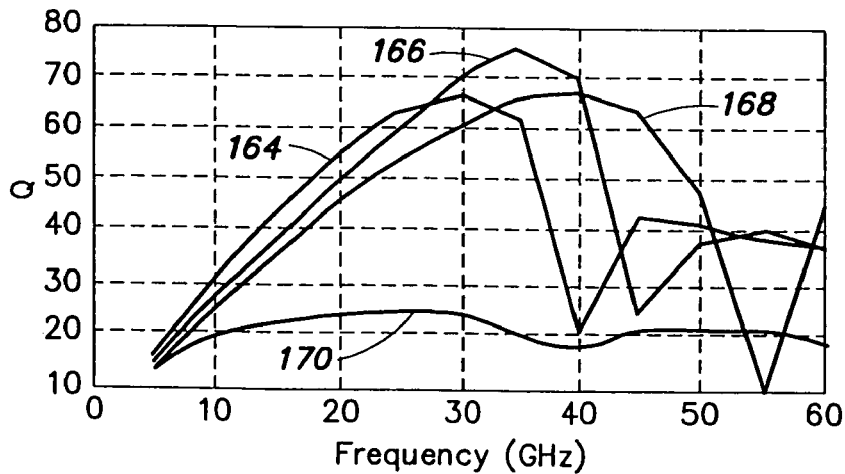

FIGS. 6A, 6B and 6C are three graphs illustrating a number of plots of simulated quality factor Q (vertical axis of the graphs) vs. signal frequency in GHz (horizontal axis of the graphs) for the apparatus 60 shown in FIGS. 5A and 5B using a variety of different values for the various dimensions and spacings discussed above (i.e., the length $l_s$ of the conductive strips of the array 62, the width $d_A$ of each conductive strip, and the space $d_B$ between neighboring conductive strips). It should be appreciated that the particular structures simulated to provide the graphs of FIGS. 6A, 6B and 6C are merely exemplary, and that various apparatus pursuant to the present disclosure are not limited to the simulated examples. The simulated devices and the results generated therefrom are discussed herein primarily for purposes of illustrating some of the concepts discussed immediately above with respect to exemplary favorable conditions for Q-enhancement.

In the simulations reflected in the graphs of FIGS. 6A, 6B and 6C, the substrate 103 of the apparatus 60 shown in FIGS. 5A and 5B is silicon having a thickness $d_{sub}$ of 250 micrometers, a permittivity $\epsilon_{sub}$ of 11.9, and a conductivity $\sigma_{sub}$ of 10 Siemens/meter. The dielectric material 101 is silicon oxide having a thickness $d_{die}$ of 5.155 micrometers and a permittivity $\epsilon_{die}$ of 4.0. The width W of each of the conductors 100A and 100B of the coplanar stripline 100 is 80 micrometers, and the space S between the conductors is 60 microns, such that the overall width D of the coplanar stripline is 220 micrometers. The thickness $t_{cps}$ of each conductor 100A and 100B is 0.925 micrometers, the space $d_s$ between the coplanar stripline and the array 62 is 1.0 micrometer, and the thickness $t_{strip}$ of each conductive strip is 0.64 micrometers. Finally, the length $L_{CPS}$ of the simulated apparatus is 400 micrometers.

With the foregoing values used as constants for all simulations resulting in the graphs of FIGS. 6A, 6B, and 6C, the length $l_s$ of the conductive strips of the array 62, the width $d_A$ of each conductive strip, and the space $d_B$ between neighboring conductive strips were each varied independently of the other to observe the effect on the quality factor Q of the apparatus. Table 1 below summarizes the various values for these parameters used in the simulations resulting in the graphs of FIGS. 6A, 6B and 6C, and is followed by a more detailed discussion of the graphs. Each plot referenced in Table 1 and indicated in FIGS. 6A, 6B, and 6C represents a different simulated apparatus.

TABLE 1

| Plot No. | Length $l_s$ (microns) | Width $d_A$ (microns) | Space $d_B$ (microns) |
|---|---|---|---|
| 150 | 240 | 5 | 5 |
| 152 | 400 | 5 | 5 |
| 154 | 180 | 5 | 5 |
| 156 | 240 | 5 | 5 |
| 158 | 240 | 1 | 5 |
| 160 | 240 | 10 | 5 |
| 162 | 240 | 20 | 5 |
| 164 | 240 | 5 | 5 |

TABLE 1-continued

| Plot No. | Length $l_s$ (microns) | Width $d_A$ (microns) | Space $d_B$ (microns) |
|---|---|---|---|
| 166 | 240 | 5 | 10 |
| 168 | 240 | 5 | 20 |
| 170 | 240 | 5 | 0.5 |

FIG. 6A shows three plots 150, 152 and 154 respectively representing apparatus having three different lengths $l_s$ for the conductive strips, while the width $d_A$ and the space $d_B$ both are held constant at 5 micrometers each. In particular, the plot 150 reflects a length $l_s$ of 240 micrometers (slightly longer than the width D of the coplanar stripline), the plot 152 reflects a length $l_s$ of 400 micrometers (significantly longer than the width D of the coplanar stripline), and the plot 154 reflects a length $l_s$ of 180 micrometers (less than the width D of the coplanar stripline).

From the graph of FIG. 6A, it may be readily observed that at a frequency near 30 GHz, the highest quality factor Q of approximately 65 is obtained in the simulated apparatus in which the length $l_s$ is approximately equal to and slightly longer than the width D of the coplanar stripline. As discussed further below in connection with FIG. 9A, it should be appreciated however that each of the simulated devices in FIG. 6A achieves significant Q-enhancement relative to an apparatus based on a coplanar stripline using similar dimensions and materials, but without the array 62 of conductive metal strips. In particular, the quality factor Q of such devices without the array 62 remains less than 10 in the frequency range of from approximately 5–60 GHz (see plot 176 of FIG. 9A). Hence, the addition of the array 62 to such an apparatus (e.g., as shown in FIGS. 5A and 5B) generally results in significant Q-enhancement throughout this frequency range for a variety of different lengths $l_s$ of the conductive strips.

FIG. 6B shows four plots 156, 158, 160 and 162 respectively representing apparatus having four different widths $d_A$ for the conductive strips, while the length $l_s$ for the strips is held constant at 240 micrometers and the space dB between the strips is held constant at 5 micrometers. In particular, the plot 156 reflects a width $d_A$ of 5 micrometers (i.e., equal to the space $d_B$); thus, this plot is identical to the plot 150 shown in FIG. 6A. The plot 158 in FIG. 6B reflects a width $d_A$ of 1 micrometer (significantly less than the space $d_B$), the plot 160 reflects a width $d_A$ of 10 micrometers (twice the space $d_B$) and the plot 162 reflects a width $d_A$ of 20 micrometers (significantly more than the space $d_B$).

From the graph of FIG. 6B, it may be readily observed that at a frequency near 30 GHz, the highest quality factor Q of approximately 65 is obtained in the simulated apparatus in which the width $d_A$ and the space $d_B$ both are 5 micrometers, which is significantly less than the overall width D and length $L_{CPS}$ of the coplanar stripline 100. Again, though, it should be appreciated that each of the simulated devices in FIG. 6B, with the exception of the device represented by the plot 162 (in which the width $d_A$ is significantly more than the space $d_B$), achieves significant Q-enhancement (Q>10) relative to an apparatus based on a coplanar stripline using similar dimensions and materials, but without the array 62 of conductive strips (e.g., see plot 176 of FIG. 9A). In the case of the plot 162 of FIG. 6B, the significantly greater width $d_A$ relative to space $d_B$ may cause the conductive strips to begin to resemble a conductive plate below the coplanar stripline rather than an array, thereby undermining the role of the array 62 toward reducing losses in the apparatus and enhancing the quality factor Q.

FIG. 6C shows four plots 164, 166, 168 and 170 respectively representing apparatus having four different spaces $d_B$ between neighboring conductive strips, while the length $l_s$ for the strips is held constant at 240 micrometers and the width $d_A$ of each strip is held constant at 5 micrometers. In particular, the plot 164 reflects a space $d_B$ of 5 micrometers (i.e., equal to the width $d_A$), the plot 166 reflects a space $d_B$ of 10 micrometers (twice the width $d_A$), the plot 168 reflects a space $d_B$ of 20 micrometers (significantly more than the width $d_A$) and the plot 170 reflects a space $d_B$ of 0.5 micrometers (significantly less than the width $d_A$).

It should be appreciated that the plot 164 of FIG. 6C is identical to the plot 156 of FIG. 6B and the plot 150 of FIG. 6A, namely, both the width $d_A$ and the space $d_B$ are 5 micrometers, for which the highest Q of 65 was obtained in the simulations of FIGS. 6A and 6B at a frequency near 30 GHz. From the graph of FIG. 6C, however, it is interesting to note from the plot 166 that at a frequency near 30 GHz, a slightly higher quality factor Q of approximately 70 is obtained in the simulated apparatus in which the space dB is 10 micrometers and the width $d_A$ is 5 microns. Also noteworthy from plot 166 is that the highest Q of 75 for the simulations in FIG. 6C is obtained with this configuration at a frequency of about 35 GHz.

In any case, in the simulations of FIG. 6C, again both of the dimensions for the width $d_A$ and space $d_B$ are significantly less than the overall width D and length $L_{CPS}$ of the coplanar stripline 100. Also, each of the simulated devices in FIG. 6C achieves significant Q-enhancement (Q>10) relative to an apparatus based on a coplanar stripline using similar dimensions and materials, but without the array 62 of conductive strips (e.g., see plot 176 of FIG. 9A). In the case of the plot 170 of FIG. 6C, the somewhat less dramatic Q-enhancement resulting from the significantly greater width $d_A$ (5 micrometers) relative to space $d_B$ (0.5 micrometers) again may be due to the conductive strips beginning to resemble a conductive plate below the coplanar stripline rather than an array, thereby undermining the role of the array 62 toward reducing losses in the apparatus and enhancing the quality factor Q.

Figure 7A:
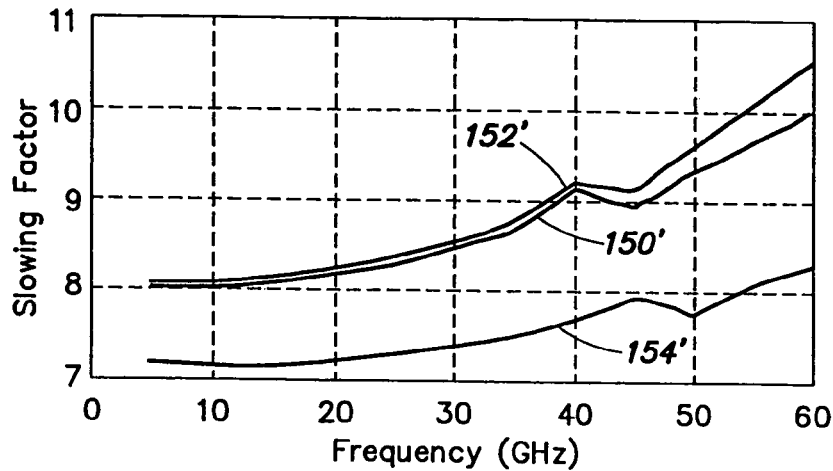
FIGS. 7A, 7B and 7C are three graphs illustrating a simulated slowing factor or phase velocity reduction vs. signal frequency for the different configurations represented in FIGS. 6A, 6B, and 6C, according to various embodiments of the invention.
Figure 7B:
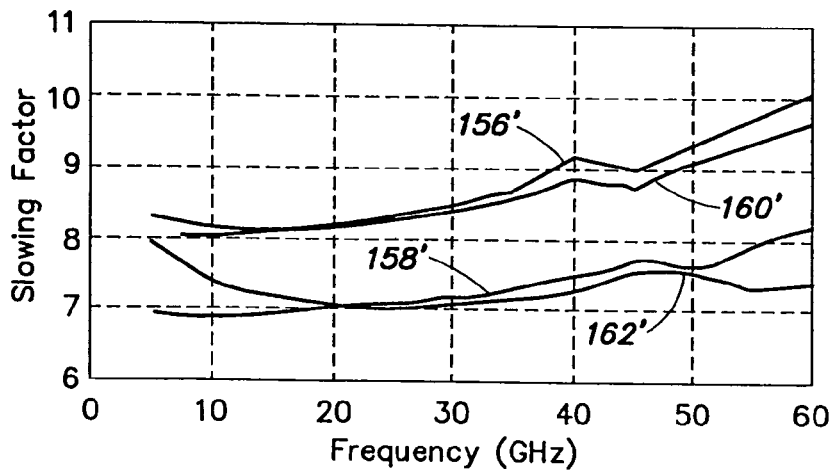
Figure 7C:
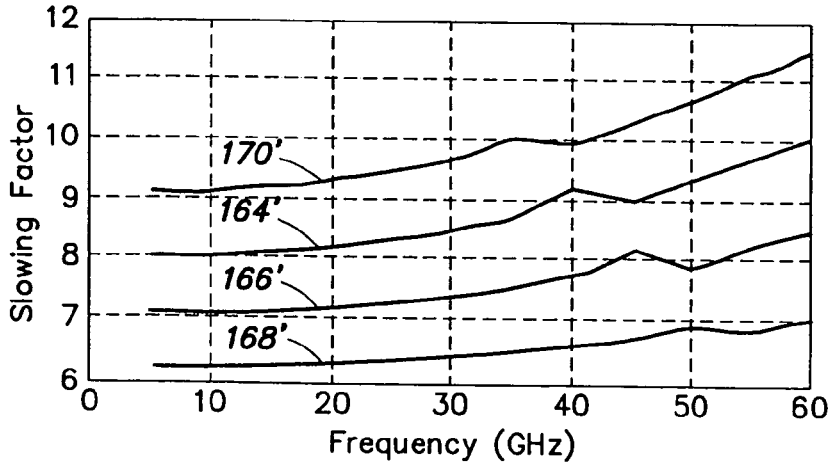

FIGS. 7A, 7B and 7C are three graphs illustrating plots of a "slowing factor" or phase velocity reduction (vertical axis of the graphs) vs. signal frequency in GHz (horizontal axis of the graphs) respectively corresponding to the simulations illustrated in the graphs of FIGS. 6A, 6B, and 6C. In particular, the plots 150', 152' and 154' of FIG. 7A correspond to the same simulation conditions (see Table 1) as the plots 150, 152 and 154 of FIG. 6A, while the plots of FIGS. 7B and 7C have a similar correspondence with the plots of FIGS. 6B and 6C. In the graphs of FIGS. 7A, 7B and 7C, and as discussed elsewhere herein, the "slowing factor" is defined as c/v, wherein c represents the wave velocity in air (i.e., $c=1/\sqrt{\epsilon_o\mu_o}$), and v represents the phase velocity in the given simulated coplanar stripline-based apparatus.

As can be readily observed in the graphs of FIGS. 7A, 7B and 7C, all of the simulated apparatus based on the dimensions given in Table 1 exhibit some significant degree of phase velocity reduction. It is interesting to note, however, that the plots indicating the greatest degree of phase velocity reduction in the graphs of FIGS. 7A, 7B and 7C (i.e., plots 152', 156' and 170') do not necessarily correspond in all cases to the plots indicating the greatest degree of Q-enhancement in the graphs of FIGS. 6A, 6B and 6C (e.g., compare the plot 150 of FIG. 6A to the plot 150' of FIG. 7A).

Hence, these graphs illustrate the appreciable degree of latitude in designing various CPS-based apparatus according to the present disclosure, and "optimizing" an apparatus for a particular application. Stated differently, specific dimensions for various components of an apparatus according to the present disclosure may be selected at least in part based on the respective importance in a given application of size reduction (which relates to phase velocity reduction) and loss (which relates to the quality factor Q).

Again, it should be appreciated that the particular structures simulated to provide the graphs of FIGS. 6A, 6B, 6C, 7A, 7B and 7C are merely exemplary, and that various apparatus pursuant to the present disclosure are not limited to the specific materials and dimensions employed in these examples. In sum, however, these simulations generally demonstrate that both significant Q-enhancement and phase velocity reduction may be realized in coplanar stripline-based apparatus according to various embodiments of present invention. These simulations also provide noteworthy guidelines for configurations of such apparatus in which Q-enhancement and phase velocity reduction may be observed.

Figure 8:
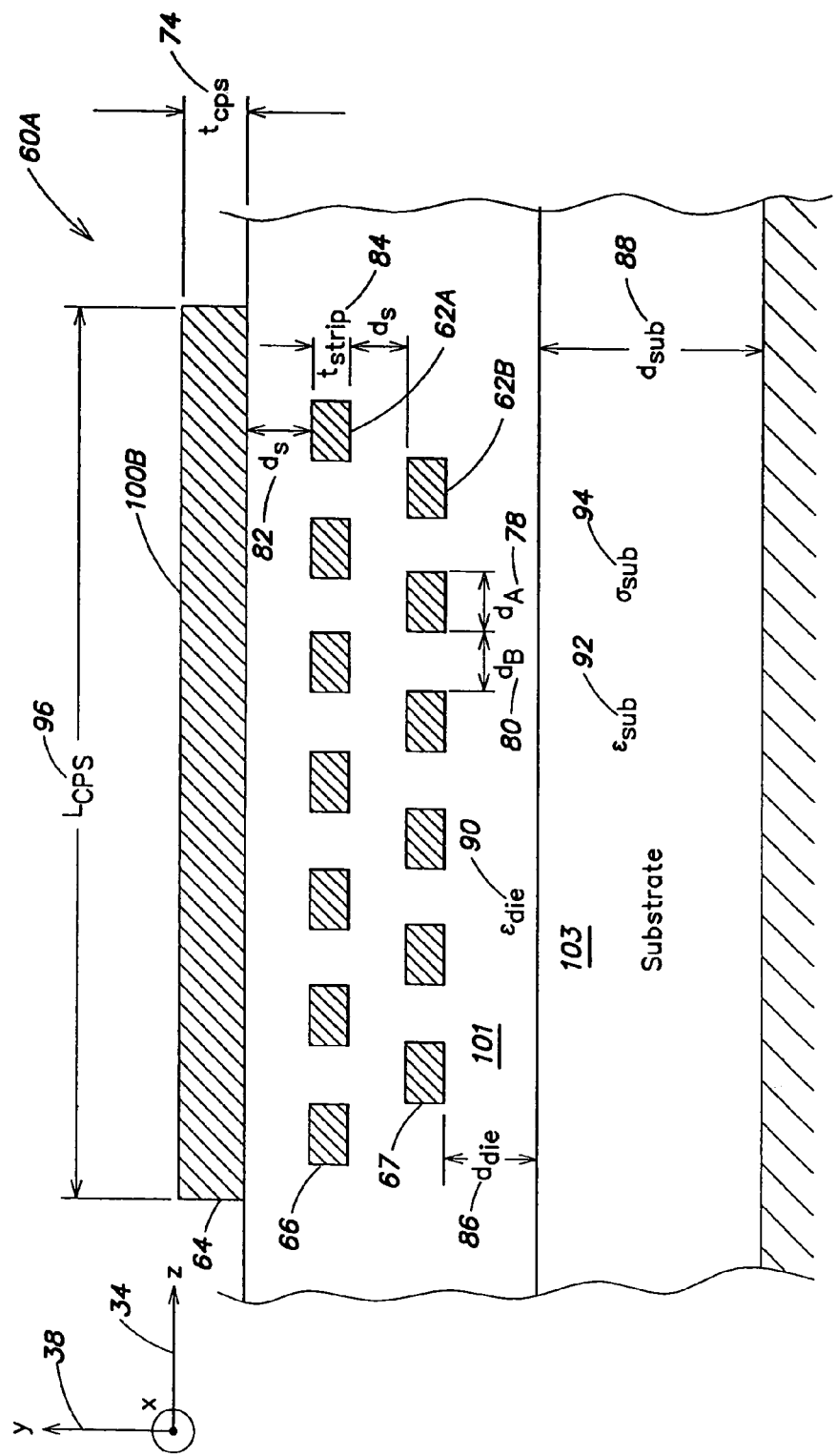
FIG. 8 is a cross-sectional view of an exemplary apparatus based on a coplanar stripline configuration, according to yet another embodiment of the invention.

FIG. 8 is a diagram illustrating a cross-sectional view (similar to that of FIG. 5B) of an apparatus 60A according to yet another embodiment of the invention. In FIG. 8, the apparatus 60A includes two arrays 62A and 62B of essentially linear conductive strips, wherein one of the arrays 62A is disposed in the second plane 66, and another of the arrays 62B is disposed in a third plane 67 essentially parallel to the first plane 64 and the second plane 66. According to one aspect of the embodiment shown in FIG. 8, the conductive strips of the arrays 62A and 62B are arranged in an alternating fashion, such that no normal to the first, second and third planes passes through both a conductive strip of the array 62A and a conductive strip of the array 62B. The multiple arrays 62A and 62B employed in the apparatus 60A of FIG. 8 generally facilitate a further phase velocity reduction as compared to the apparatus 60 shown in FIGS. 5A and 5B, while at the same time maintaining an appreciable degree of Q-enhancement as compared to a coplanar stripline-based apparatus without any array(s) of conductive strips.

Figure 2A:
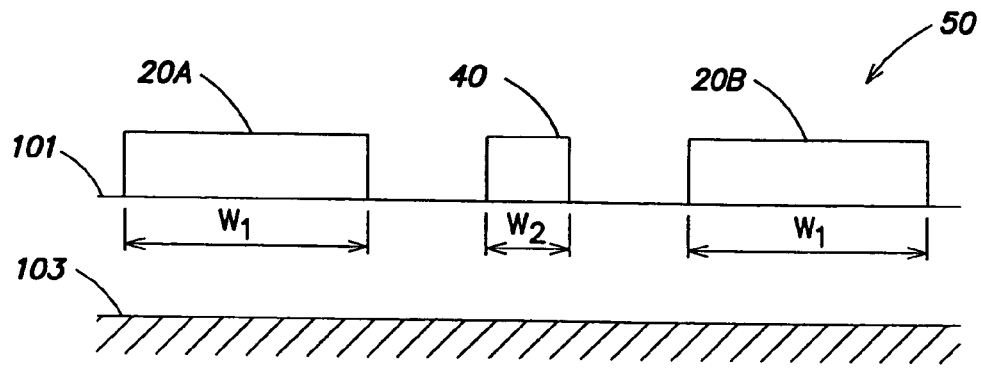
FIGS. 2A and 2B show different views of a conventional coplanar waveguide (CPW)
Figure 2B:
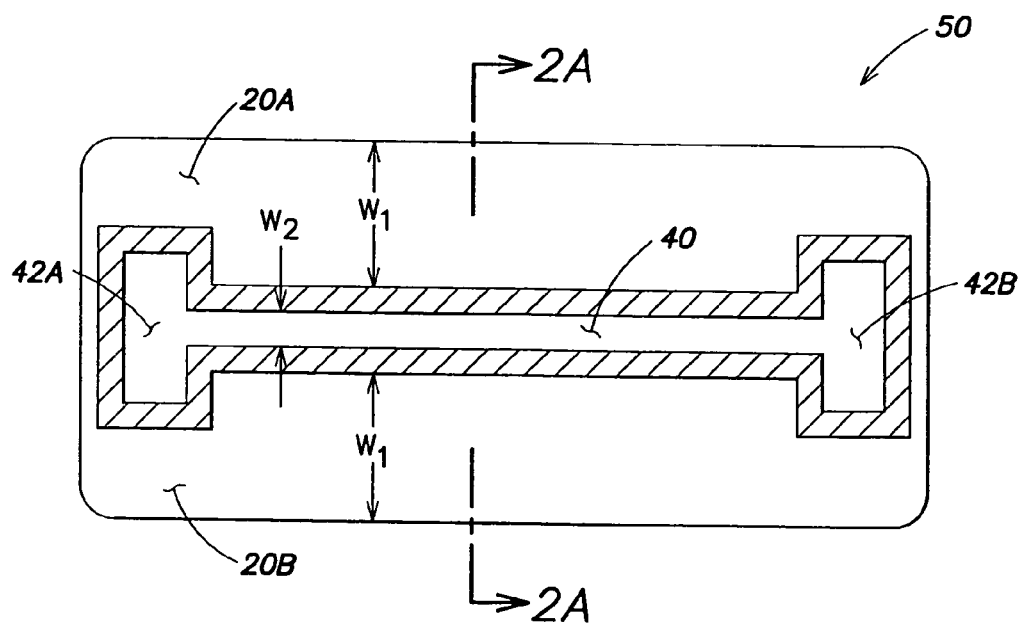
Figure 3A:
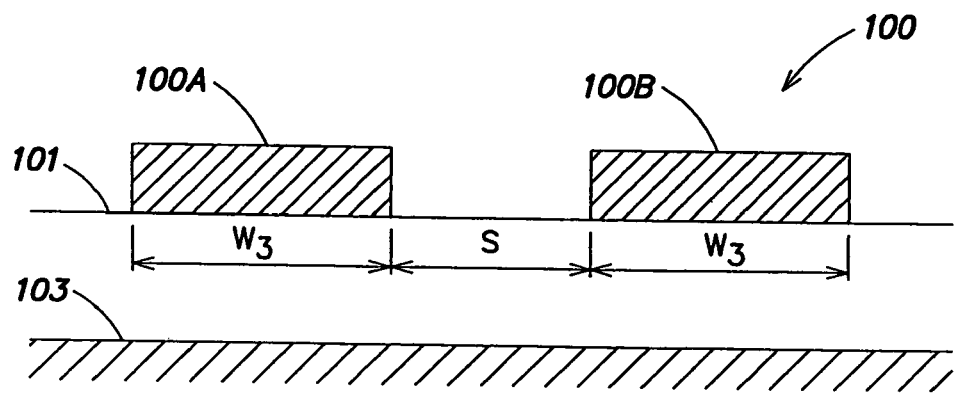
FIGS. 3A and 3B show different views of a conventional coplanar stripline (CPS)
Figure 3B:
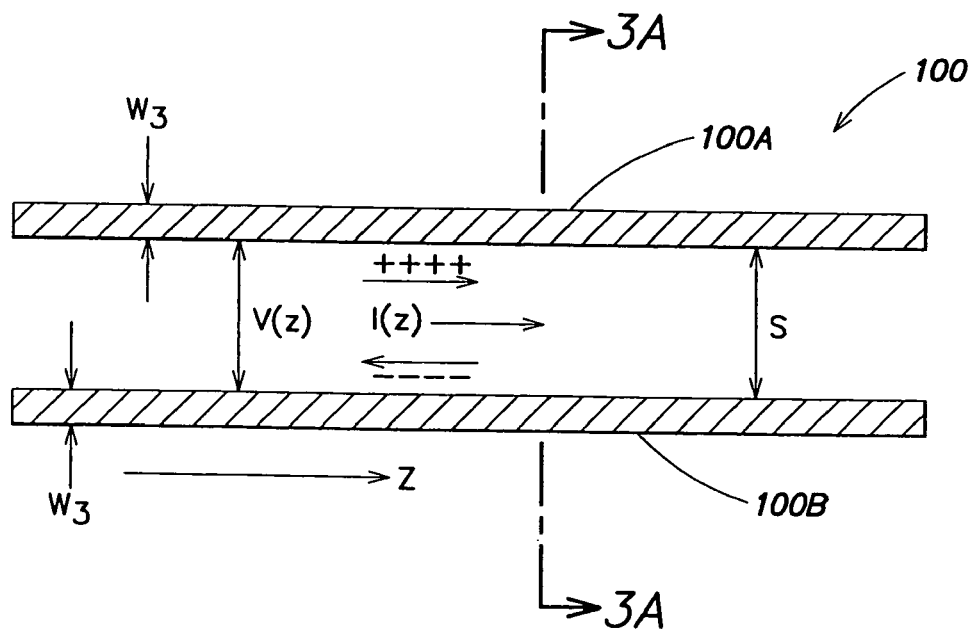
Figure 4A:
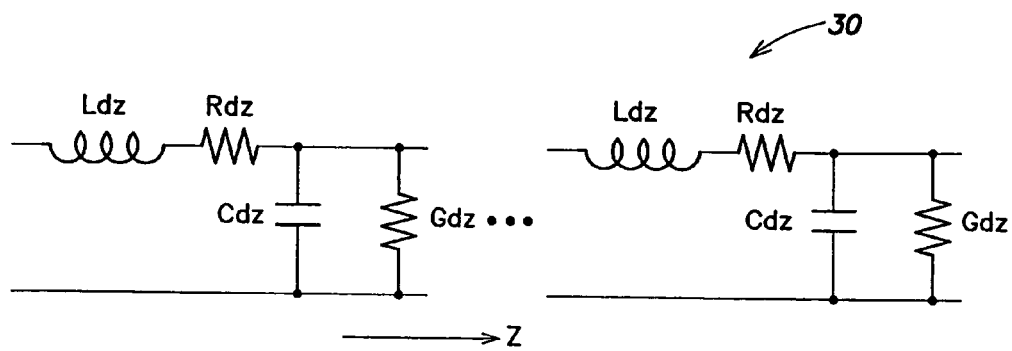
FIG. 4A shows a "single-ended" model of distributed line parameters for the coplanar waveguide of FIGS. 2A and 2B.
Figure 4B:
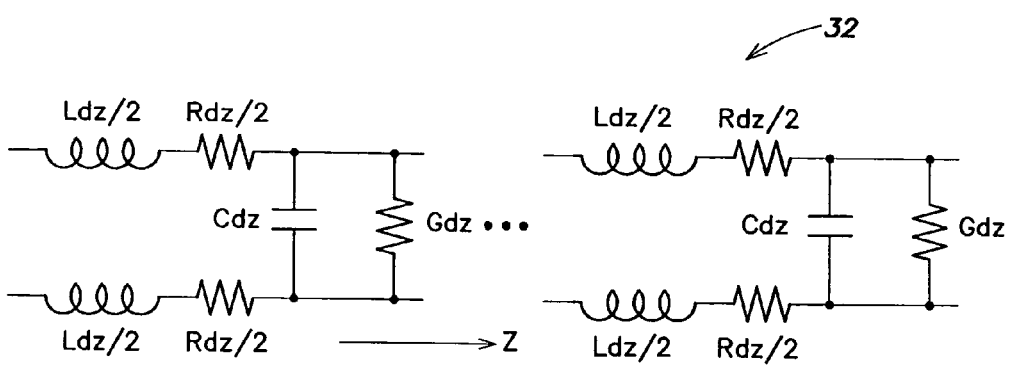
FIG. 4B shows a "differential" model of distributed line parameters for the coplanar stripline of FIGS. 3A and 3B.
Figure 9A:
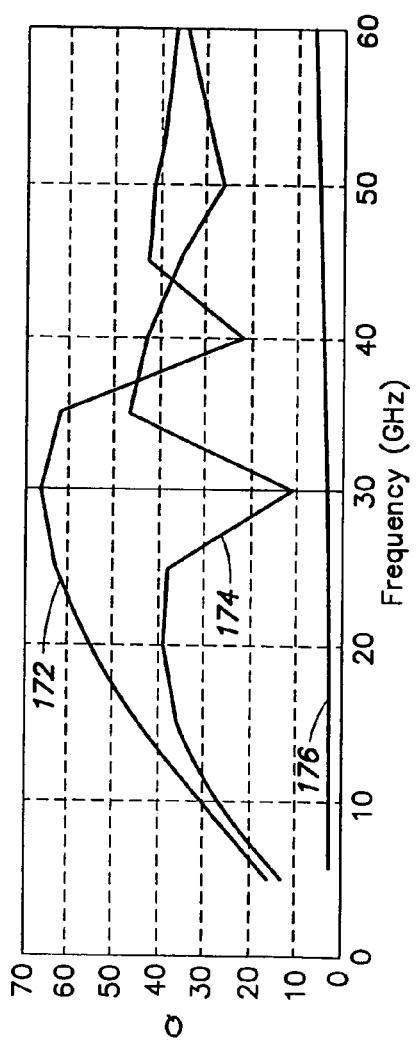
FIGS. 9A and 9B are two graphs respectively comparing quality factor Q and slowing factor or phase velocity reduction for different apparatus based on the configurations shown in FIGS. 5A and 5B, and FIG. 8, according to various embodiments of the invention.
Figure 9B:
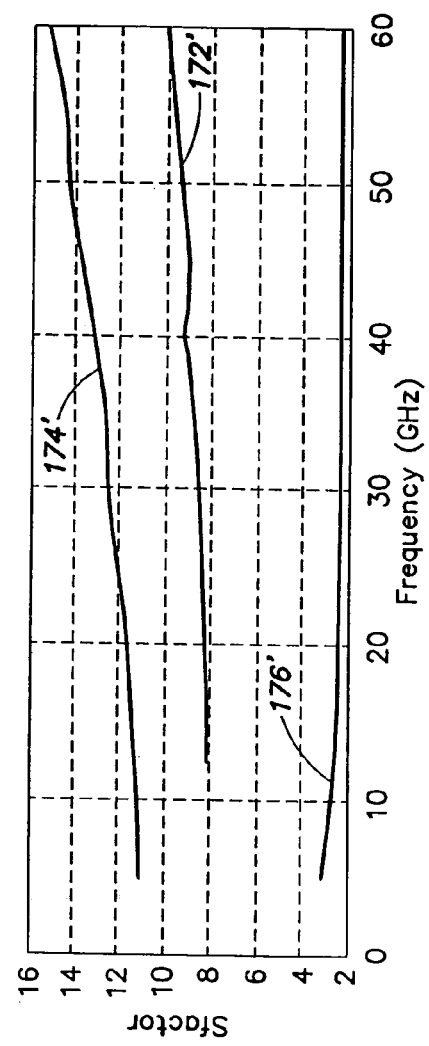

FIGS. 9A and 9B illustrate two graphs, of quality factor Q vs. frequency and slowing factor or phase velocity reduction vs. frequency, respectively, comparing results of simulations based on the multiple-array apparatus 60A of FIG. 8, the single-array apparatus 60 of FIGS. 5A and 5B, and a similarly-dimensioned coplanar stripline apparatus without any array(s) of conductive strips (e.g., see FIGS. 3A and 3B). Specifically, in FIG. 9A, the plot 172 represents simulation results of Q vs. frequency for the single-array apparatus 60, the plot 174 represents simulation results of Q vs. frequency for the multiple-array apparatus 60A, and the plot 176 represents simulation results of Q vs. frequency for a coplanar stripline apparatus without any array(s) of conductive strips. In FIG. 9B, the plot 172' represents simulation results of slowing factor vs. frequency for the single-array apparatus 60, the plot 174' represents simulation results of slowing factor vs. frequency for the multiple-array apparatus 60A, and the plot 176' represents simulation results of slowing factor vs. frequency for a coplanar stripline apparatus without any array(s) of conductive strips.

In the graphs of FIGS. 9A and 9B, again a silicon substrate and a silicon oxide dielectric material are employed in all of the simulated apparatus, with material parameters ($\epsilon_{die}$, $\epsilon_{sub}$, $\sigma_{sub}$) and a substrate thickness dub identical to those discussed above in connection with the simulations represented in FIGS. 6A, 6B and 6C. Additionally, the coplanar stripline dimensions W, S, D, $L_{CPS}$ and $t_{cps}$ are identical to those discussed above in connection with FIGS. 6A, 6B and 6C. For the single-array and multiple-array apparatus simulations of FIGS. 9A and 9B, the length $l_s$ of each conductive strip is 240 micrometers, the width $d_A$ of each strip is 5 micrometers, the space $d_B$ between neighboring strips of the same array is 5 micrometers, and the thickness $t_{strip}$ of each conductive strip is 0.64 micrometers. For the multiple-array apparatus, with reference to FIG. 8, the distance $d_s$ between the first and second planes, as well as the second and third planes, is 1.0 micrometer, and the dielectric thickness $d_{die}$, between the third plane 67 and the boundary with the substrate 103, is 3.515 micrometers.

As can be readily observed in FIG. 9A, while the multiple-array apparatus, as represented by the plot 174, does not achieve as high a quality factor Q as the single-array apparatus (represented by the plot 172), both the multiple-array and single-array apparatus achieve some significant degree of Q-enhancement as compared to a coplanar stripline-based apparatus without any array(s), as represented by the plot 176. More specifically, the plot 176 (representing essentially a coplanar stripline on a silicon substrate) remains significantly below a Q of 10 for most of the frequency range between approximately 5 GHz and 60 GHz, whereas the plots 172 and 174 remain significantly above a Q of 10 for most of this frequency range.

In FIG. 9B, it is readily observed that the multiple-array apparatus, as represented by the plot 174', achieves a significantly higher slowing factor or phase velocity reduction than the single-array apparatus represented by the plot 172'. However, again both the single-array apparatus and the multiple-array apparatus achieve significant phase velocity reduction as compared to the coplanar stripline-based apparatus without any array(s), represented by the plot 176'.

Figure 10:
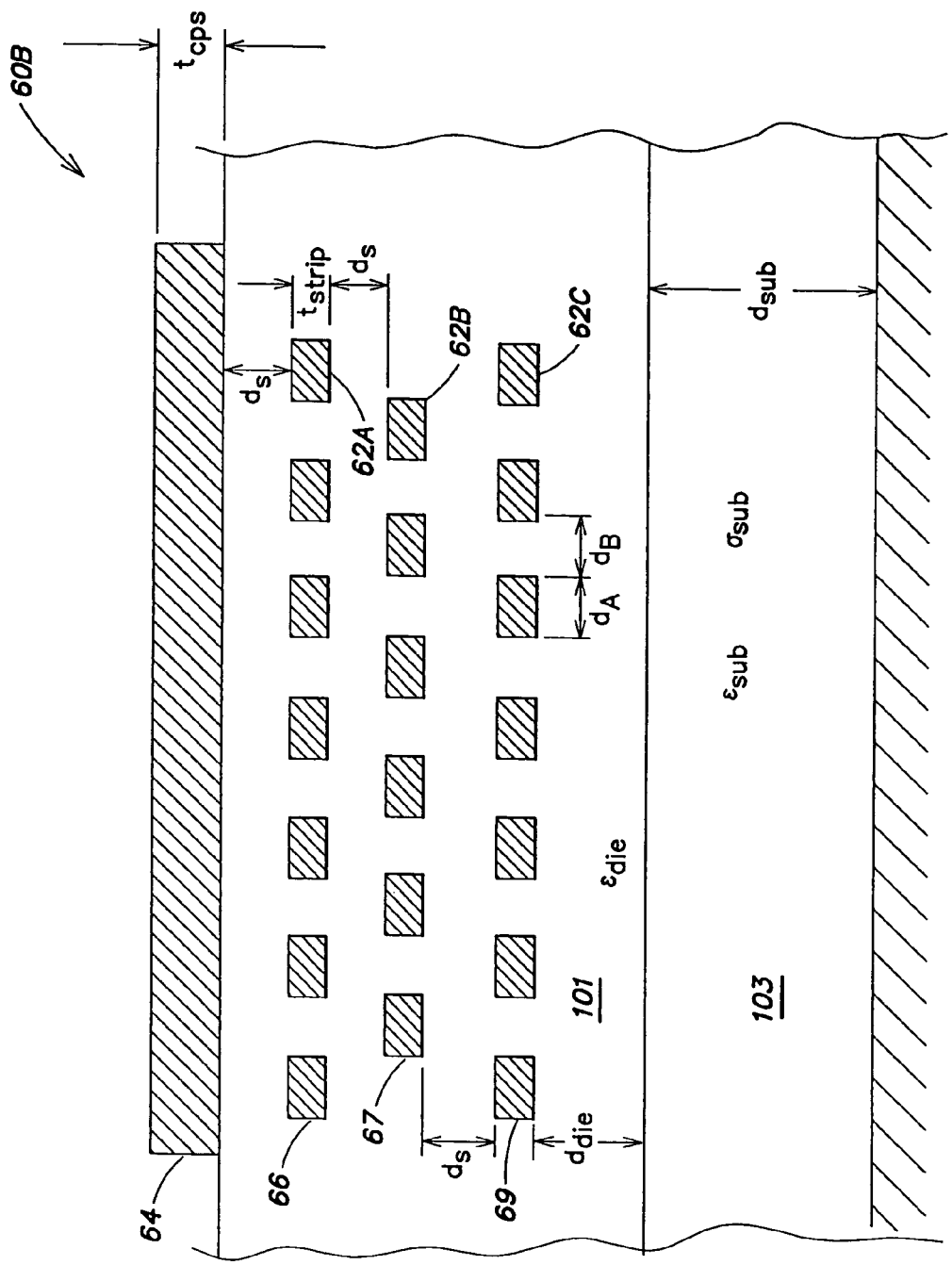
FIG. 10 illustrates a cross-sectional view of an exemplary apparatus based on a coplanar stripline configuration, according to another embodiment of the invention.
Figure 11:
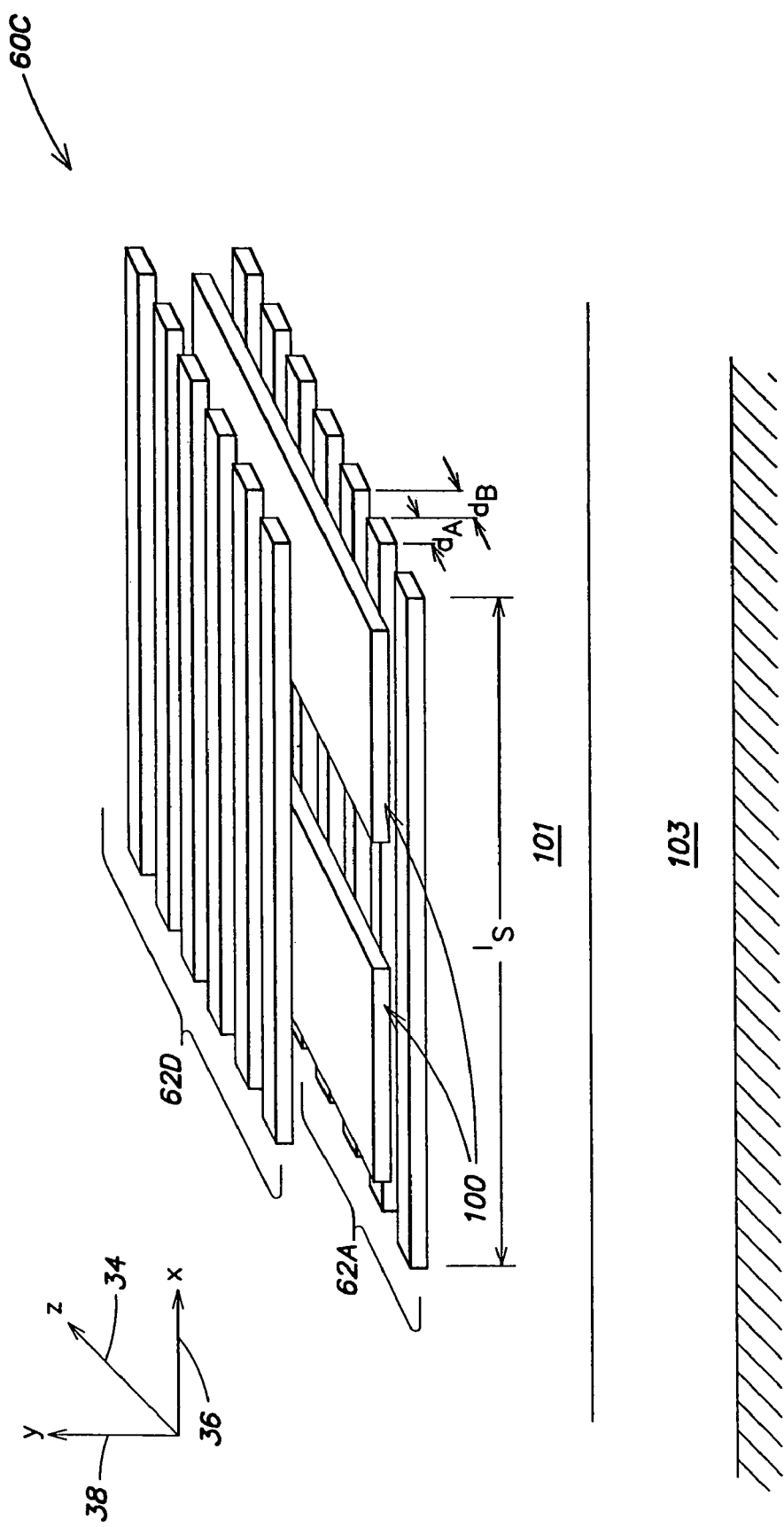
FIG. 11 illustrates a perspective view of an exemplary apparatus based on a coplanar stripline configuration, according to another embodiment of the invention.

In yet other embodiments, different numbers and arrangements of multiple arrays of conductive strips may be employed together with a coplanar stripline to facilitate one or both of Q-enhancement and phase velocity reduction. For example, FIG. 10 illustrates a cross-sectional view (similar to that of FIGS. 5B and 8) of an apparatus 60B, according to one embodiment of the invention, which employs three arrays 62A, 62B and 62C of essentially linear conductive strips. The apparatus 60B of FIG. 10 is substantially similar to that shown in FIG. 8, with the exception of the addition in FIG. 10 of the array 62C disposed in a fourth plane 69 parallel to the first plane 64, the second plane 66 and the third plane 67. FIG. 11 illustrates a perspective view (similar to that of FIG. 5A) of yet another apparatus 60C, according to one embodiment of the invention, which employs two arrays 62A and 62D of conductive strips, wherein the array 62A and 62D are disposed respectively below and above the coplanar stripline 100. According to different aspects of the embodiment of FIG. 11, the individual conductive strips of one of the arrays 62A and 62D may be arranged in vertical alignment (i.e., along the y-axis) with a corresponding strip of another of the arrays 62A and 62D or, alternatively, the individual strips of the arrays may be arranged in an alternating manner (e.g., similar to the multiple-array arrangements shown in FIGS. 8 and 10). In still other embodiments, one or more arrays of conductive strips may be arranged above and/or below the coplanar stripline 100 in a variety of manners.

II. Coplanar Stripline Standing Wave Oscillators

Having discussed various concepts relating to coplanar stripline configurations according to the present disclosure that may be generally employed in a variety of different devices, exemplary coplanar stripline devices according to other embodiments of the present invention, based on a standing wave oscillator, are now presented. It should be appreciated that, according to different embodiments discussed in detail below, standing wave oscillators according to the present invention may or may not be configured with one or more arrays of conductive strips, as discussed above in Section 1.

a. Background

One of the most basic and ubiquitous building blocks of communications systems, as well as a host of other applications, is the oscillator. Essentially all communications systems at some point need a reference oscillator to facilitate a variety of communication-related functions. As a result, oscillator design in the high frequency regime is an active area of interest. In particular, electromagnetic wave effects that need to be accounted for as system frequency dramatically increases have led to significant interest in various high frequency oscillator designs based on transmission lines.

Various types of oscillators based on transmission line implementations conventionally have been employed to generate high frequency clock signals in the gigahertz (GHz) range. Many of these conventional approaches ultimately are directed at generating essentially square wave clock signals that may be globally distributed throughout an integrated circuit system without significant propagation-delay-induced phase shifts. More specifically, these approaches generally aim to generate a global clock signal with low clock skew and low clock jitter that may be propagated across an entire system in a manner that preserves the correct ordering of events throughout the system. Both traveling wave oscillators (TWOs) and standing wave oscillators (SWOs) based on transmission line implementations have been employed for such purposes.

Standing waves are of particular interest in connection with the present disclosure due to the unique characteristics of such waves. A standing wave is formed when two waves traveling in opposite directions with identical amplitude and frequency interact. Unlike a traveling wave, which has an amplitude and phase that varies over time at a given position along a transmission line, a standing wave has a constant amplitude and phase at a given position along a transmission line, wherein the amplitude varies sinusoidally with position along the line. A common way to generate a voltage standing wave is to send an incident wave down a transmission line and reflect it back with a lossless termination such as a short circuit. However, losses from the transmission line conductors themselves (e.g., "series" losses due to R and "parallel" losses due to G) typically cause amplitude mismatch between the incident and reflected waves, resulting in a residual traveling wave which distorts the standing wave. Accordingly, to effectively implement a self-sustaining standing wave oscillator, some type of compensation scheme (i.e., amplification) must be employed to overcome the losses inherent in the transmission line.

Figure 12:
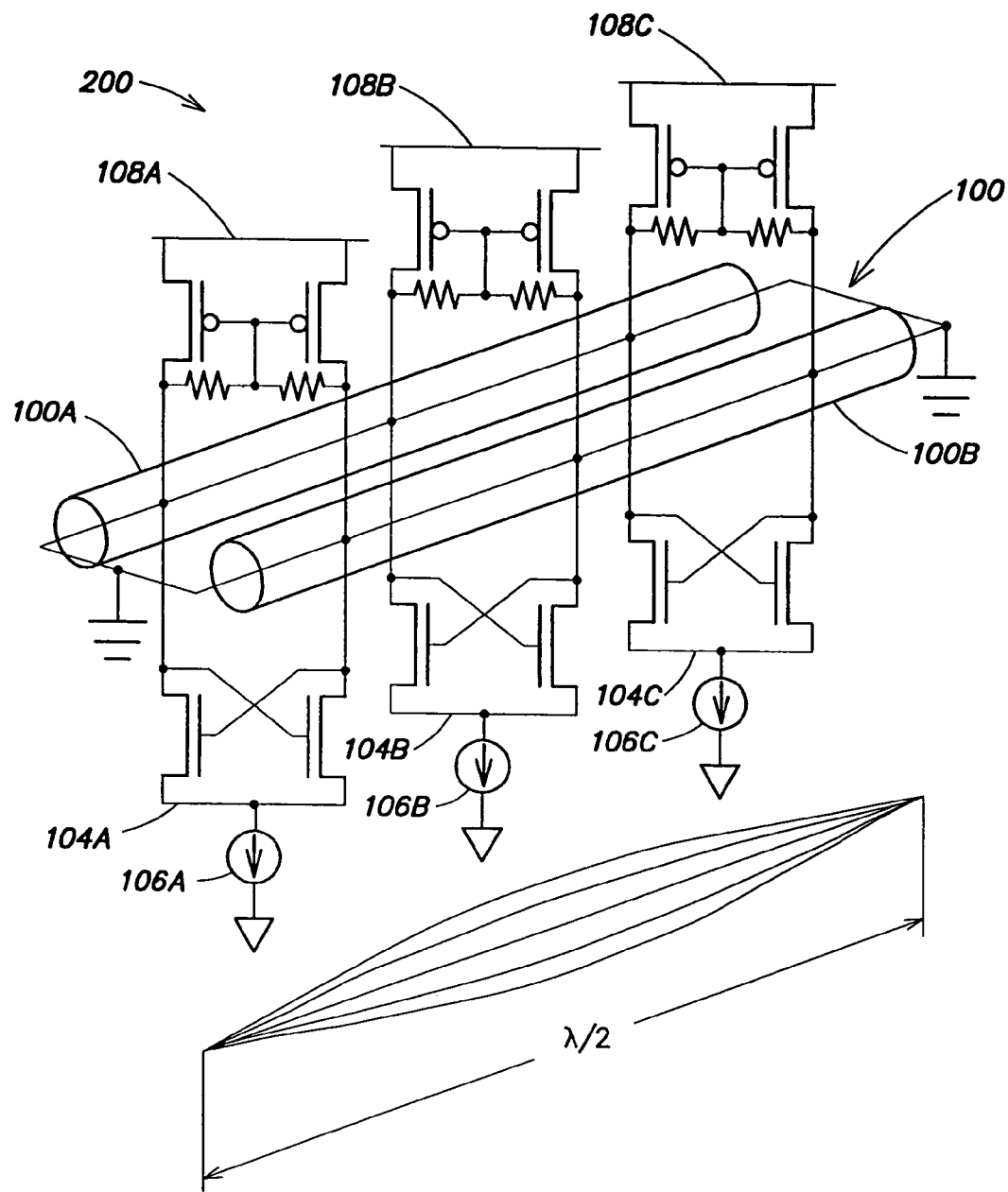
FIG. 12 illustrates an example of a conventional standing wave oscillator based on a coplanar stripline implementation.

One conventional implementation of a standing wave oscillator using a coplanar stripline is shown in FIG. 12. In FIG. 12, a coplanar stripline 100 (similar to that shown in FIGS. 3A and 3B) having conductors 100A and 100B is configured to form a half-wave ($\lambda/2$) resonator 200 by shorting out both ends of the length of the coplanar stripline, thereby forcing a voltage standing wave "node" (i.e., zero potential between the conductors 100A and 100B) at both ends of the coplanar stripline. Theoretically, the resonator 200 supports at least one standing wave having a frequency related to $\lambda$, wherein the amplitude of the wave varies along the length of the resonator, as shown schematically at the bottom of FIG. 12.

In the oscillator configuration of FIG. 12, the effect of coplanar stripline conductor loss on signal amplitude is offset by providing distributed amplifiers (i.e., transconductors) spaced along the length of the resonator to provide a distributed transconductance. In particular, FIG. 12 illustrates a number of NMOS cross-coupled-pair transconductors 104A, 104B and 104C supplied by three respective current sources 106A, 106B and 106C. Each of these transconductors is coupled to the conductors 100A and 100B of the coplanar stripline 100 at a different position along the coplanar stripline. A number of PMOS diode-connected loads 108A, 108B and 108C also are coupled to the coplanar stripline 100 to establish a common-mode voltage between the conductors 100A and 100B.

It is noteworthy that in the configuration of FIG. 12, the transconductors 104A, 104B and 104C are configured to have a same gain. The gain of a given transconductor is related to the current provided by the current source associated with the transconductor (one of the current sources 106A, 106B and 106C) multiplied by the width of the transistors making up the transconductor (i.e., transistor gain increases with increasing width and/or current). In the oscillator configuration shown in FIG. 12, each transistor of a cross-coupled pair has a same width, and each transconductor is provided with a same current; hence, the transconductors all have a same gain. The use of multiple same gain transconductors to compensate for conductor loss on the coplanar stripline permits an equivalent lumped model for such a coplanar stripline that facilitates a relatively straightforward determination of the resonator parameters required to support oscillation at a given frequency.

However, one issue that arises from employing multiple transconductors having a same gain in the configuration of FIG. 12 is that significant energy arguably is wasted due to over-amplification. More specifically, again with reference to the wave illustration at the bottom of FIG. 12, it should be readily appreciated that for the wave mode illustrated, the amplitude of the wave near the center of the resonator structure has a maximum value and steadily decreases away from the center and towards either end of the resonator. Hence, to support the illustrated mode, the transconductors 104A and 104C, which are configured to have the same gain as the transconductor 104B located at the center of the resonator, arguably are configured for a higher amplification than necessary; in particular, these transconductors utilize more current than necessary, thereby wasting valuable power resources.

Yet another issue that arises from the oscillator configuration of FIG. 12 is that the resonator does not employ any mode control mechanism (e.g., suppression of higher order modes). As a result, this configuration has the tendency to excite strong high frequency modes. The lack of mode control in this configuration ultimately deteriorates the quality of the generated sinusoidal signal, as the presence of multiple higher frequency modes distorts the sinusoidal waveform at the fundamental resonance frequency.

For example, the equal-gain amplifiers evenly distributed along the length of the resonator structure shown in FIG. 12 theoretically can support a mode at $\lambda/2$, as shown in FIG. 12, as well as other odd harmonics such as $\lambda$, $(3/2)\lambda$, $(5/2)\lambda$, $3\lambda$, etc.; specifically, each amplifier is capable of acting as an electrically open node that can support a higher frequency mode. In this manner, the resonator of FIG. 12 is not optimized for sinusoidal waveform generation. This condition may be significantly undesirable for many applications. It should be appreciated, however, that since the ultimate use of the resonator shown in FIG. 12 is for an essentially square-wave clock generator, the presence of some higher order modes may not substantially affect the overall performance of the resonator toward generating such a clock signal.

Applicants have recognized and appreciated that conventional standing wave oscillators (SWOs) based on coplanar stripline implementations may be modified and improved to facilitate the generation of high quality, high frequency sinusoidal signals. The general frequency range for sinusoidal signals generated by SWOs considered by the present disclosure includes frequencies from approximately 1 GHz to 100 GHz, although it should be appreciated that the present disclosure is not limited in this respect. According to various embodiments of the present invention discussed further below, single mode SWOs may be particularly configured to generate sinusoidal signals in these exemplary frequency ranges with low power dissipation and low phase noise. A number of contemplated applications for such oscillators include, but are not limited to, communications systems including wireless communications, radar, phase-locked loops (PLL) for various applications, and the like.

b. Quarter-Wavelength Coplanar Stripline Standing Wave Oscillators

Figure 13A:
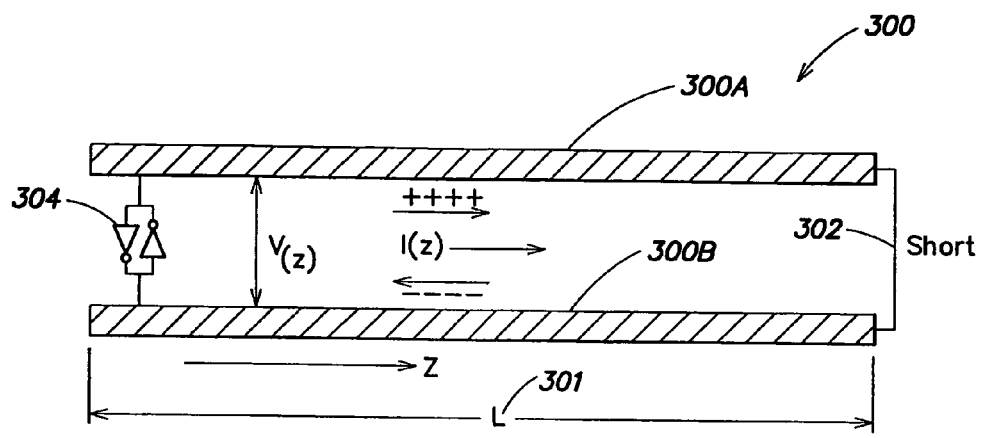
FIG. 13A illustrates an example of a quarter-wavelength coplanar stripline standing wave oscillator, according to one embodiment of the invention.
Figure 13B:
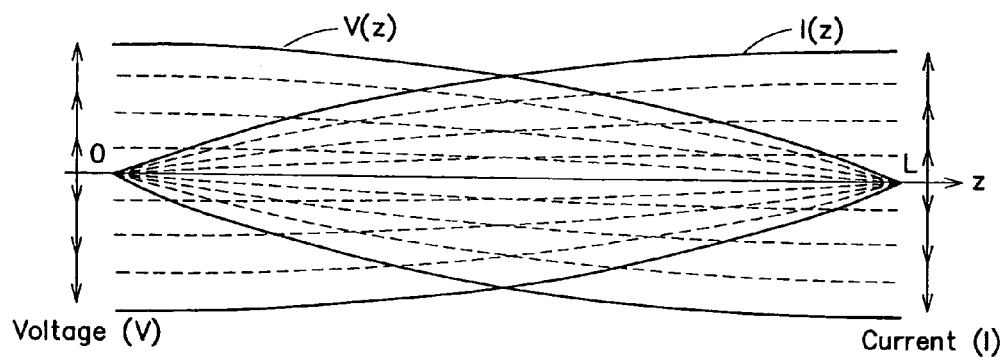
FIG. 13B illustrates voltage and current waveforms for the oscillator shown in FIG. 13A.

FIGS. 13A and 13B illustrate some fundamental concepts underlying a coplanar stripline SWO according to one embodiment of the invention. In particular, FIG. 13A illustrates an essentially quarter-wavelength ($\lambda/4$) coplanar stripline SWO 300 that includes conductors 300A and 300B forming a differential coplanar stripline (i.e., similar to the coplanar stripline 100 of FIGS. 3A and 3B). The SWO 300 is formed by a length L (reference numeral 301) of the coplanar stripline, with one end of the coplanar stripline terminated by a short 302, and the other end of the line terminated by a pair of cross-coupled inverters serving as an amplifier 304. In another aspect of this embodiment, the amplifier 304 may be implemented in a manner similar to that shown in FIG. 12 by an NMOS cross-coupled transconductor pair driven by a current source (for clarity of the drawing, the NMOS transistors and the current source are not shown explicitly in FIG. 13A, but represented schematically by the cross-coupled inverters). Such an amplifier forms an active positive feedback network, converting DC energy into RF energy and injecting this energy into the circuit to compensate losses relating to the coplanar stripline.

The SWO 300 shown in FIG. 13A is configured to support standing waves that satisfy the boundary conditions at both ends of the coplanar stripline, namely, having a maximum voltage amplitude swing at the amplifier end of the coplanar stripline and a zero voltage node at the shorted end of the line. Accordingly, the possible excitation modes based on a length L of coplanar stripline theoretically correspond to $L=\lambda/4+n(\lambda/2)$ (for n=0, 1, 2, 3 . . . ). In practical implementations, the actual length L that supports excitation modes may differ slightly from the theoretical lengths for any of a variety of reasons discussed further below. The fundamental frequency of oscillation $f_o$ corresponds to n=0, that is $f_o=v/(4L)$, where v is the wave's phase velocity as determined by the materials both surrounding and constituting the coplanar stripline.

FIG. 13B schematically illustrates the voltage and current waves along the length of the SWO 300, indicated respectively in the figure as V(z) and I(z), for the fundamental mode supported by the SWO 300. The graph of FIG. 13B is illustrated along a z-axis corresponding to the length of the SWO, where z=0 corresponds to the position of the amplifier 304 and z=L corresponds to the position of the shorted end. From FIG. 13B, it may be readily appreciated that while the voltage amplitude swing V(z) is maximum at the left in the drawing (z=0) and decreases to zero moving to the right and arriving at the shorted end (z=L), the current I(z) behaves in an opposite manner; namely, the current is minimum at the left and increases moving to the right, being maximum at the shorted end of the coplanar stripline. According to one aspect of this embodiment, an output of the SWO may be derived across the amplifier 304 (i.e., the point of maximum voltage amplitude swing), wherein the output is appropriately buffered to reduce any load on the SWO.

c. Standing Wave Oscillators with Distributed/Tailored Gain Cells

Figure 14A:
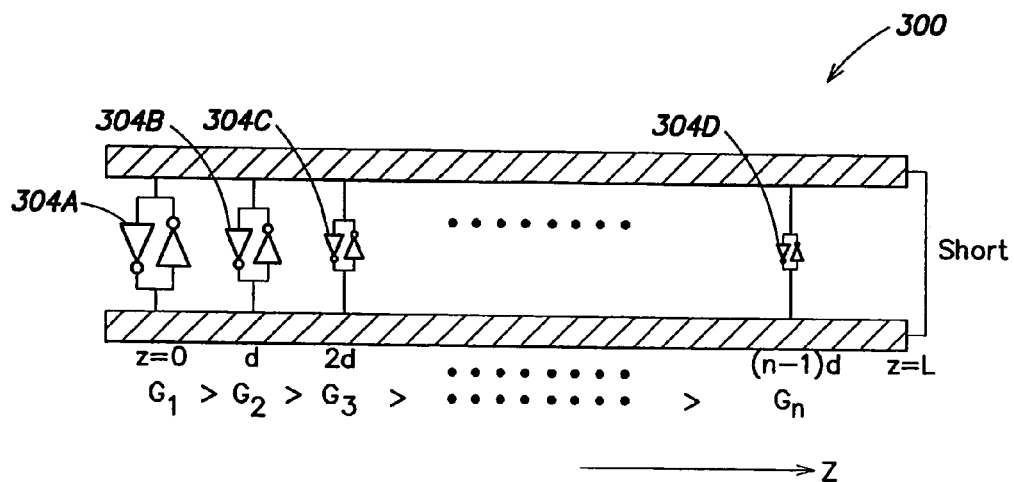
FIG. 14A illustrates an example of a quarter-wavelength coplanar stripline standing wave oscillator employing multiple amplifiers, according to one embodiment of the invention.

Another embodiment of the invention based on the ($\lambda/4$) coplanar stripline SWO 300 shown in FIG. 13A is illustrated in FIG. 14A and relates to distributed amplification. It should be appreciated, however, that the concepts discussed in connection with this embodiment may be implemented in a variety of other SWO configurations according to the present invention, as discussed herein. Accordingly, the particular example discussed immediately below relating to a quarter-wavelength SWO is provided primarily for purposes of illustration.

Figure 14B:
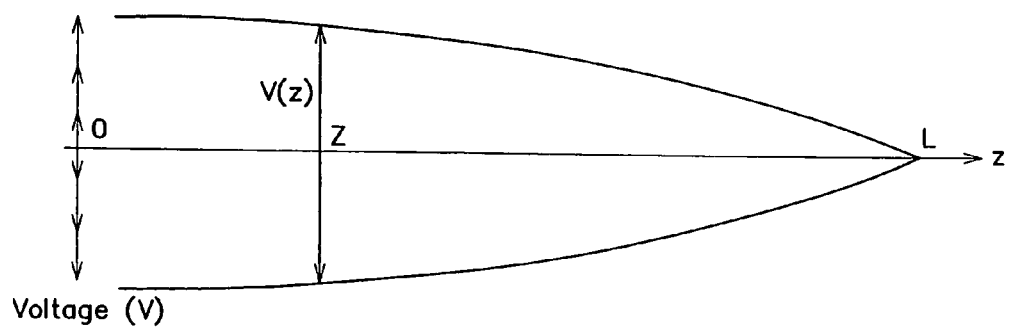
FIG. 14B illustrates a voltage waveform for the oscillator shown in FIG. 14A.

To facilitate an explanation of this embodiment, the voltage waveform shown in FIG. 13B is reproduced in FIG. 14B. In the embodiment of FIG. 14A, a plurality of amplifiers or "gain cells" 304A, 304B, 304C . . . 304D are deployed along the length of the coplanar stripline. While FIG. 14A explicitly illustrates four such amplifiers, it should be appreciated that the invention is not limited in this respect, as different numbers of amplifiers may be employed in SWOs according to the invention. Also, while the amplifiers are schematically represented in FIG. 14A as being equally spaced along the coplanar stripline, the invention also is not limited in this respect, as a variety of positions for the amplifiers are possible according to different embodiments. In general, it should be appreciated that the number and placement of amplifiers according to various embodiments of the invention, as well as the respective gains of the amplifiers, may depend at least in part on one or more desired modes to be excited by the oscillator, as discussed further below.

For example, according to one aspect of the embodiment shown in FIG. 14A, the relationship between the respective gains of the amplifiers are tailored to approximate the relationship between the expected voltage amplitudes of the desired standing wave mode at different positions along the coplanar stripline at which the amplifiers are deployed. For example, with reference to FIG. 14B, since the voltage amplitude of the illustrated standing wave mode decreases from left to right along the length of the coplanar stripline, the respective gains $G_1$, $G_2$, $G_3$ . . . $G_n$ of the amplifiers also are decreased from left to right along the coplanar stripline (i.e., moving from z=0 to z=L). In this manner, the gains of the amplifiers in this example are "amplitude-dependent."

In the embodiment shown in FIG. 14A, some well-known benefits of distributed amplification (e.g., increased frequency response) are achieved while at the same time conserving valuable power resources by tailoring the gains of the amplifiers. Recall that, in a conventional SWO implementation shown in FIG. 12, multiple distributed amplifiers are configured to have same gains notwithstanding the different voltage amplitudes at the amplifier deployment positions; hence, in this conventional configuration, significant energy arguably is wasted due to over-amplification. In contrast, the SWO implementation of FIG. 14A using tailored gain amplifiers according to the present invention requires less total current to operate than a similar implementation using multiple same-gain amplifiers, thereby conserving valuable power resources.

Moreover, the multiple tailored gain amplifiers of the embodiment shown in FIG. 14A additionally function as a mode control mechanism to ensure oscillation substantially in a single mode (e.g., corresponding to $\lambda/4$). Again, this is in contrast to the conventional configuration using multiple same-gain amplifiers shown in FIG. 12 which theoretically can support a number of other modes, thereby degrading the sinusoidal quality of a signal generated by the oscillator.

To compare and contrast the embodiments of FIG. 13A (one lumped amplifier) and FIG. 14A (distributed amplifiers), exemplary implementations of these SWOs employing a coplanar stripline having a length of approximately 1500 micrometers have been analyzed. In the exemplary implementation corresponding to FIG. 14A, four amplifiers are used along the coplanar stripline, placed at equal intervals of $z=0$, $z=L/4$, $z=L/2$ and $z=3L/4$. Recall that, as discussed above, the gain of a given amplifier is proportional to the square root of the product of transistor size and current drawn. All of the transistors used in the amplifiers have lengths of 0.18 microns. The transistor widths and current drawn by each amplifier, which determine the amplifier gain, respectively are as follows:

| Amplifier Position | Transistor Widths (microns) | Current Drawn (mA) |
|---|---|---|
| $z = 0$ | 22.5 | 12 |
| $z = L/4$ | 22.5[sin(3π/8)] | 12[sin(3π/8)] |
| $z = L/2$ | 22.5[sin(π/4)] | 12[sin(π/4)] |
| $z = 3L/4$ | 22.5[sin(π/8)] | 12[sin(π/8)] |

In this implementation, the SWO oscillates at 12.19 GHz, with a maximum voltage amplitude at $z=0$ of 2.09 Volts.

In the exemplary implementation corresponding to FIG. 13A, the gain of the single amplifier 304 is chosen to be equal to the total lumped gain of the distributed amplifiers used in the implementation corresponding to FIG. 14A. More specifically, the length of the transistors of the amplifier 304 is again 0.18 micrometers, and the transistor widths are given by 22.5[1+sin(3π/8)+sin(π/4)+sin(π/8)] microns. Similarly, the total current conducted by the amplifier is 12[1+sin(3π/8)+sin(π/4)+sin(π/8)] milliamperes. This SWO oscillates at 9.76 GHz, with a maximum voltage amplitude at $z=0$ of 2.27 Volts. Hence, while the exemplary lumped amplifier SWO based on FIG. 13A achieves a higher amplitude, the exemplary distributed amplifier SWO based on FIG. 14A achieves an appreciably higher frequency of operation.

e. Standing Wave Oscillator Employing a Tapered Coplanar Stripline

Figure 15A:
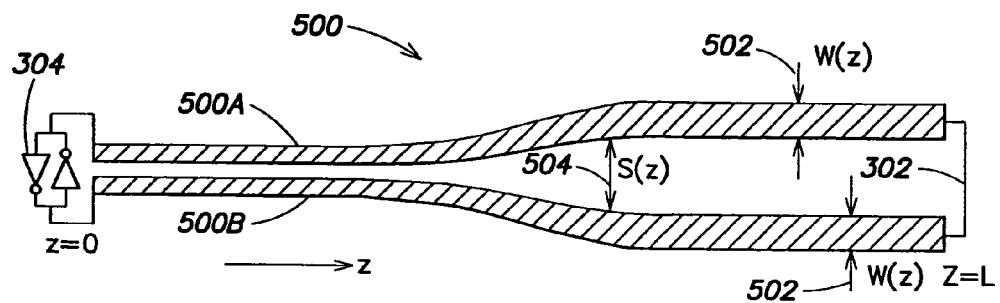
FIG. 15A illustrates a quarter-wavelength standing wave oscillator employing a tapered coplanar stripline configuration according to one embodiment of the invention.

FIG. 15A illustrates another embodiment of a ($\lambda/4$) coplanar stripline SWO 500 according to the invention, wherein the SWO is based on a tapered coplanar stripline configuration with position-dependent line parameters. To facilitate an explanation of the embodiment shown in FIG. 15A of the SWO 500 employing a tapered configuration, the voltage and current waveforms shown in FIG. 13B for a ($\lambda/4$) coplanar stripline SWO are reproduced in FIG. 15B. It should be appreciated, however, that the concepts discussed in connection with this embodiment may be implemented in a variety of other SWO configurations according to the present invention, as discussed herein. Accordingly, the particular example discussed immediately below relating to an essentially quarter-wavelength SWO is provided primarily for purposes of illustration. Additionally, as discussed below, it should be appreciated that a tapered coplanar stripline configuration according to the present invention is not limited in application for use in a SWO, and may be employed in other CPS-based devices.

1. Coplanar Striplines with Position-Dependent Parameters

One embodiment of the present invention is directed to a coplanar stripline that is configured such that the resistance per unit length R and the conductance per unit length G are discrete or continuous functions of position along the coplanar stripline (i.e., R(z) and G(z)). In one aspect of this embodiment, the coplanar stripline may be further configured such that a uniform characteristic impedance is substantially maintained notwithstanding variations in R and G, so as to avoid local reflections.

In one exemplary implementation of this embodiment, as shown for example in the SWO 500 illustrated in FIG. 15A, a tapered coplanar stripline configuration is employed wherein a space 504 between coplanar stripline conductors 500A and 500B, and/or a width 502 of each conductor 500A and 500B, vary discretely or continuously as a function of position z along the coplanar stripline. FIG. 15A is a top view of the tapered configuration 500 (similar to the view of FIG. 3B), wherein the space 504 in FIG. 15A is accordingly indicated with the notation S(z) and the width 502 is accordingly indicated with the notation W(z). In other respects, the tapered configuration 500 may be similar to that shown in the cross-sectional view of FIG. 3A; namely, the conductors 500A and 500B may be disposed on a dielectric material above a substrate. The tapered configuration of the conductors 500A and 500B in FIG. 15A effectively changes the coplanar stripline parameters R and G along the length of the coplanar stripline so that they are position dependent, while effectively maintaining a uniform characteristic impedance of the coplanar stripline.

In particular, the resistance per unit length R generally relates to the well-known skin effect, wherein at higher frequencies charge carriers travel closer to the edges and away from the core of a given conductor. As the two conductors making up the coplanar stripline are brought in closer proximity to each other (i.e., as the distance S decreases and/or the conductor width W increases), the respective charges flowing near the edge or "skin" of the conductors are brought more closely together, thereby impeding charge flow. Hence, as the conductors are brought more closely together, generally the resistance per unit length R increases.

The conductance per unit length G generally relates to electromagnetic field loss between the conductors and the substrate above which the coplanar stripline is disposed. With reference again particularly to the coplanar stripline cross-section illustrated in FIG. 3A, as conductors of a coplanar stripline are moved farther apart from each other (i.e., as the distance S increases and/or the conductor width W decreases), the fields due to current flowing through the conductors have more of an opportunity to interact with the substrate above which the coplanar stripline is disposed; hence, the conductance per unit length G increases. Conversely, as the conductors are brought more closely together (i.e., as the distance S decreases and/or the conductor width W increases), the loss to the substrate generally decreases, and hence the conductance per unit length G decreases.

In sum, from the foregoing, it should be appreciated that the coplanar stripline parameters R and G in the above example generally vary inversely with conductor separation; namely, as the conductors are brought more closely together, R increases and G decreases; conversely, as the conductors are separated by a greater distance, R decreases and G increases.

2. Implications of Position-dependent Parameters for an SWO

With respect to signal propagation on a coplanar stripline in general, R may be viewed as coupling to current waves whereas G may be viewed as coupling to voltage waves to introduce respective series and shunt losses; accordingly, smaller R corresponds to less series loss, and smaller G corresponds to less shunt loss. This tradeoff between series loss R and shunt loss G, due to their inverse variation with conductor separation, may impose a major constraint with respect to loss minimization in a coplanar stripline carrying traveling waves. However, when a coplanar stripline hosts a standing wave, as shown in FIG. 15B, the R-G tradeoff may be exploited via the tapered configuration 500 shown in FIG. 15A to take advantage of the position-dependent standing wave amplitude so as to significantly reduce loss (and correspondingly enhance the quality factor Q of the resulting device).

Figure 15B:
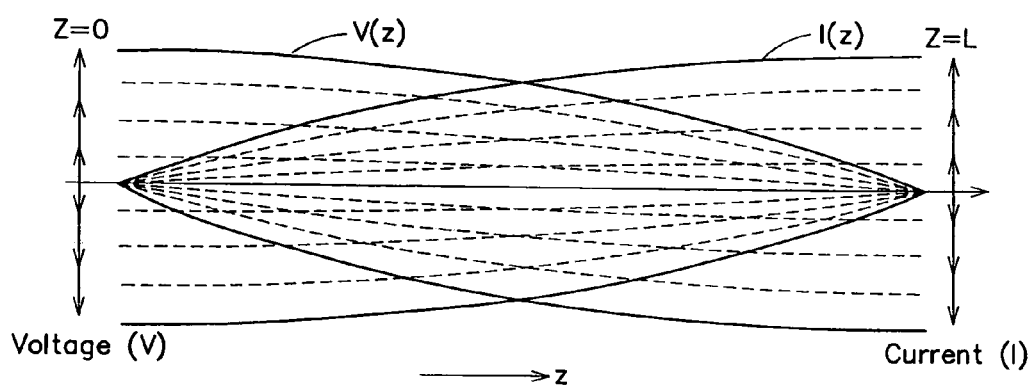
FIG. 15B is a reproduction of the voltage and current waveforms of FIG. 13B, positioned with respect to FIG. 15A so as to illustrate various concepts relating to the tapered coplanar stripline configuration, according to one embodiment of the invention.

For example, from FIG. 15B it may be appreciated that at z=0, where the voltage amplitude swing of the SWO 500 of FIG. 15A is maximum, a lower conductance per unit length G results in less power loss to the substrate, as power loss to the substrate is proportional to the square of the voltage (relatively high at z=0) multiplied by the conductance per unit length. Accordingly, even with relatively high voltage at this point, loss to the substrate can be reduced by having a coplanar stripline configuration with a low conductance per unit length G. On the other hand, at z=0, FIG. 15B illustrates that the current flowing in the conductors of the coplanar stripline is at a minimum; accordingly, any power loss due to the coplanar stripline conductors (i.e., due to the resistance per unit length R) is of less concern, since this power loss is proportional to the square of the current (relatively low at z=0) multiplied by the resistance per unit length R. Hence, even if R is high at this point, it does not necessarily induce significant losses, due to the low current.

The opposite scenario holds for z=L (i.e., at the shorted end of the coplanar stripline shown in FIG. 15A). In particular, as shown in FIG. 15B, at this point, the voltage is zero, and the current is at a maximum. Hence, having a significant resistance per unit length R at this point in the coplanar stripline would result in significant loss due to the high current, whereas the conductance per unit length G is of relatively lesser concern due to the low voltage (i.e., a zero voltage node).

In view of the foregoing, one embodiment of the invention is directed to a quarter-wavelength SWO including a coplanar stripline with varying resistance per unit length R(z) and varying conductance per unit length G(z), in which a region of low conductance per unit length (low G) is positioned at the point z=0 where a maximum voltage amplitude is expected, so as to reduce power dissipation to the substrate. Additionally, the SWO is configured such that a coplanar stripline region of low resistance per unit length (low R) is positioned at the point z=L where a maximum current is expected. The SWO 500 of FIG. 15A provides one example of such an arrangement. In general, according to this embodiment, the position-dependent voltage and current amplitudes resulting from the standing wave facilitate a reduction in device losses (and corresponding Q enhancement) by appropriately tailoring the parameters R and G based on the fixed position amplitudes.

The tapered coplanar stripline configuration employed in this embodiment (as well as other embodiments) may be implemented in a number of different ways. For example, according to one aspect, the overall length of the coplanar stripline may be divided into a discreet number of equal or varying length sections each having a different R and G, where L and C are kept constant to maintain a substantially uniform characteristic impedance to effectively prevent local reflections. Alternatively, the coplanar stripline may be implemented with a gradually tapering conductor spacing and width such that R and G vary gradually with position along the coplanar stripline, while again maintaining a substantially uniform characteristic impedance.

Figure 16:
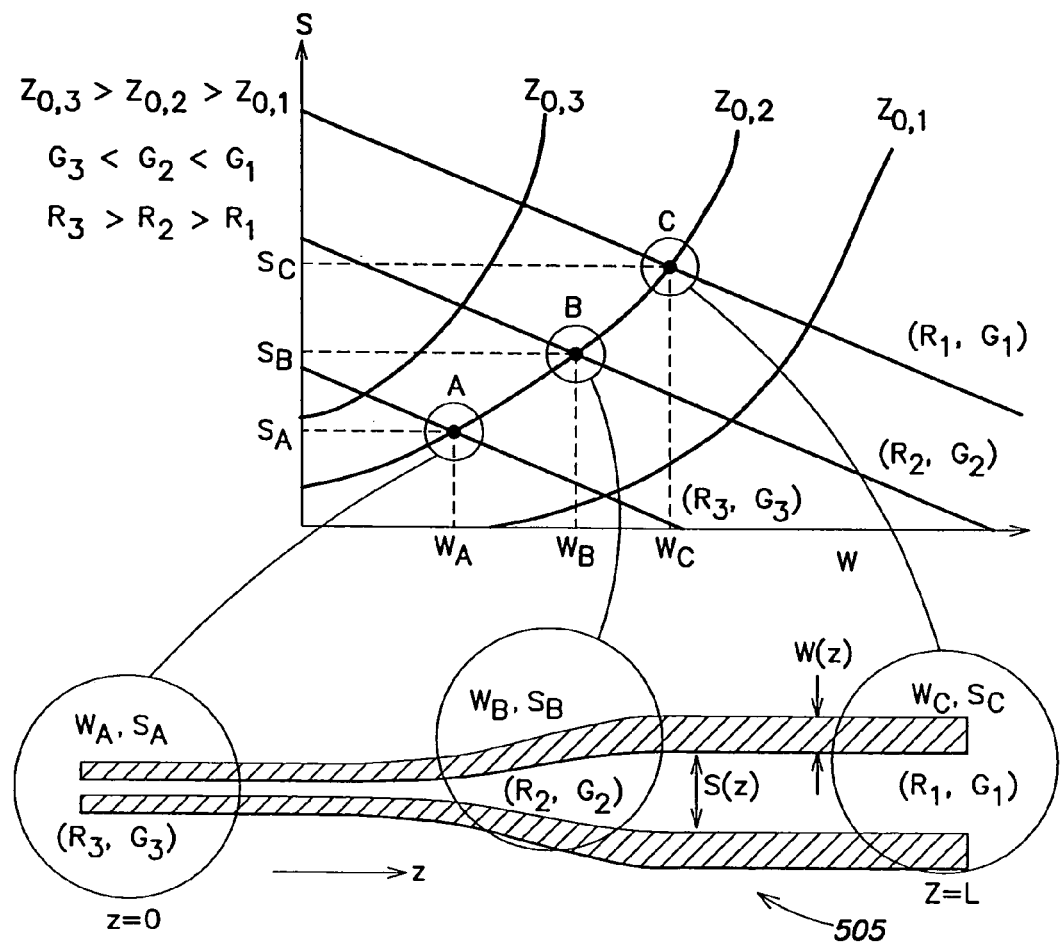
FIG. 16 illustrates a method according to one embodiment of the invention for varying R and G along a tapered coplanar stripline without altering the characteristic impedance $Z_o$ of the stripline.

FIG. 16 includes a graph and a corresponding exemplary tapered coplanar stripline configuration 505 illustrating a method according to one embodiment of the invention for varying R and G along the stripline without significantly altering the characteristic impedance $Z_o$ of the stripline. According to one aspect of this embodiment, the graph of FIG. 16 may be compiled from data acquired through computer simulations (e.g., Sonnet EM) based on varying the width W of the stripline conductors and the space S between the stripline conductors along the length of the stripline. Hence, the horizontal axis of the graph in FIG. 16 represents the width W and the vertical axis of the graph represents the space S between conductors of the stripline.

The graph of FIG. 16 includes plots of three exemplary "constant characteristic impedance contours" $Z_{o,1}$, $Z_{o,2}$ and $Z_{o,3}$; in particular, each of these contours represents a different constant characteristic impedance for varying values of W and S, wherein $Z_{o,3} > Z_{o,2} > Z_{o,1}$. FIG. 16 also includes plots of three exemplary "loss contours" $(R_1, G_1)$, $(R_2, G_2)$ and $(R_3, G_3)$, wherein each loss contour reflects a constant value for R and a corresponding constant value for G for varying values for W and S. Although the graph of FIG. 16 represents each of the loss contours as a single line representing an identical constant value for both R and G, in reality the respective values for R and G along a given loss contour are not identical, but nonetheless appreciably close to each other. Thus, in the graph of FIG. 16, it is a reasonable approximation for practical design purposes to assume that the values of R and G for each loss contour are virtually identical.

As illustrated in FIG. 16, increasing either W or S results in a decreased R and increased G due to the R-G tradeoff discussed above (i.e., $R_3 > R_2 > R_1$ and $G_3 < G_2 < G_1$). However, the characteristic impedance $Z_o$ increases with increasing S but decreases with increasing W. Accordingly, to achieve low G near z=0 and low R at z=L so as to reduce loss, without significantly affecting $Z_o$, the coplanar stripline conductors may be simultaneously widened and moved apart from z=0 to z=L, following one of the $Z_o$ contours shown in FIG. 16.

To illustrate the foregoing concepts, the design of a tapered coplanar stripline configuration having an essentially constant characteristic impedance $Z_{o,2}$ from the graph of FIG. 16 is considered as an example. It should be appreciated that the methodology underlying this example, as discussed below, may be applied similarly to other characteristic impedance contours representing a desired characteristic impedance for the resulting device.

Specifically, with reference to the constant characteristic impedance contour $Z_{o,2}$ in FIG. 16, three points A, B, and C are identified along the $Z_{o,2}$ contour, at the respective intersections of this contour with the loss contours $(R_3, G_3)$, $(R_2, $G_2$) and ($R_1$, $G_1$). As also illustrated in the example of FIG. 16, the dimensions $W_A$ and $S_A$ corresponding to the point A (i.e., high R, low G) are used for the portion of the tapered stripline 505 around z=0, the dimensions $W_B$ and $S_B$ corresponding to the point B are used for the portion around the middle of the stripline, and the dimensions $W_C$ and $S_C$ corresponding to the point C (i.e., low R, high G) are used for the portion of stripline around z=L.

While the foregoing example utilizes three points of reference A, B, and C along the characteristic impedance contour $Z_{o,2}$ to determine corresponding dimensions along the tapered coplanar stripline configuration 505, it should be appreciated that the invention is not limited in this respect; namely, any number of points along a given characteristic impedance contour theoretically may be used to determine corresponding dimensions along the tapered coplanar stripline. In particular, as the number of points increases, the resulting tapered coplanar stripline increasingly resembles one in which R and G are essentially continuous functions of position z along the stripline. It should be appreciated, however, that for virtually any finite number of points along a given impedance contour, a piecewise tapered configuration results in which R and G vary discretely (i.e., in a piecewise fashion) along the stripline.

Figure 17:
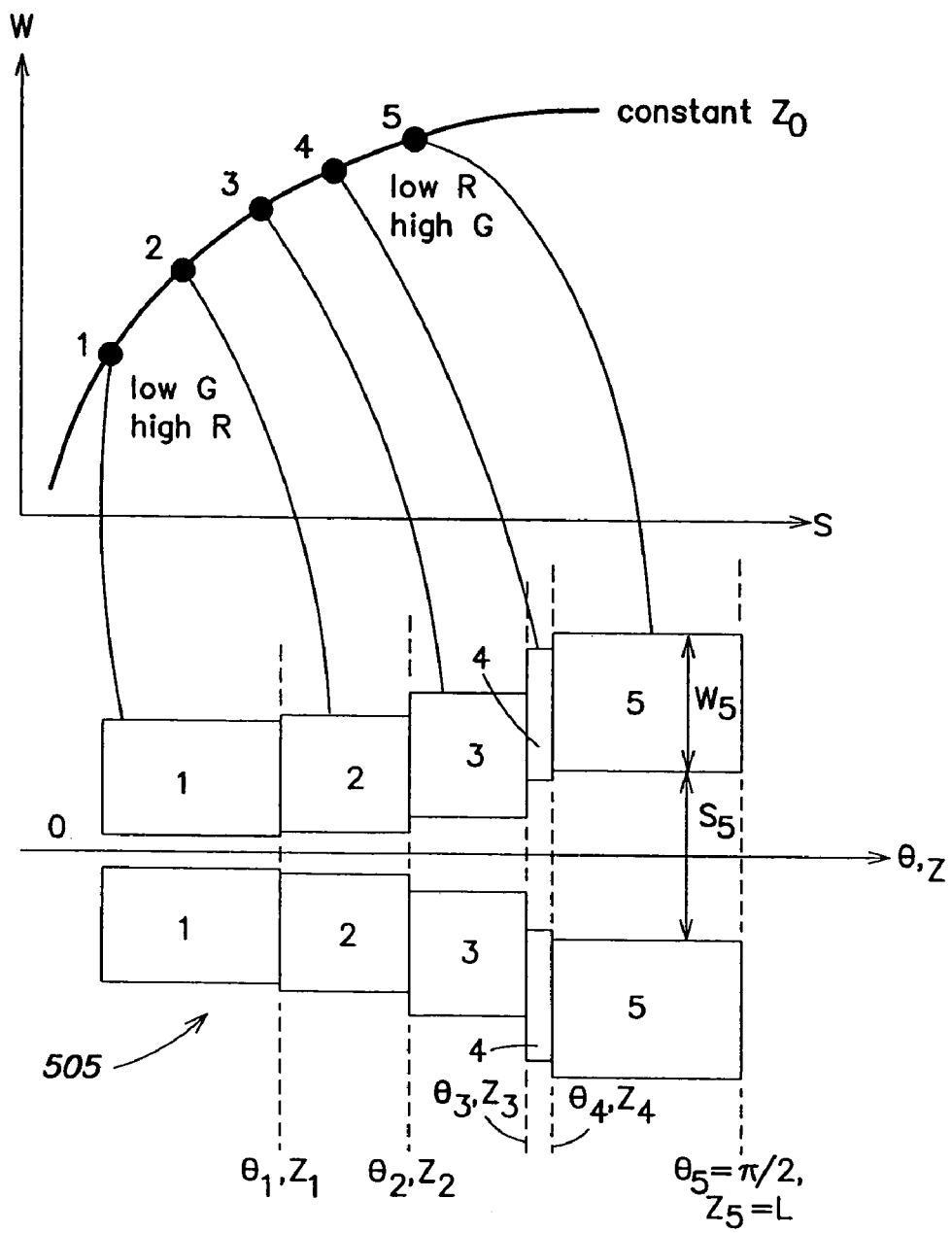
FIG. 17 further illustrates the method of FIG. 16 in connection with a piecewise tapered coplanar stripline, according to one embodiment of the invention.

FIG. 17 further illustrates the concept of such a piecewise variation. In particular, FIG. 17 includes a graph in W-S space showing a plot of an exemplary impedance contour representing a constant characteristic impedance $Z_o$ (note that the W-S axes in the graph of FIG. 17 are exchanged from those of FIG. 16). Five points (1, 2, 3, 4, and 5) are selected along this contour, corresponding to respective W and S dimensions for five different portions or sections of a piecewise tapered coplanar stripline configuration 505, shown directly below the graph in FIG. 17 (the exemplary dimensions $W_5$ and $S_5$ are indicated in FIG. 17 for section 5). Although five points are chosen in the example of FIG. 17, again it should be appreciated that different numbers of points may be chosen in other embodiments. As also illustrated qualitatively in FIG. 17, the length along the z-axis of each section 1–5 of the piecewise tapered coplanar stripline may or may not be the same as one or more other sections of the stripline; in particular, according to various embodiments, an optimal apportionment of each section 1–5 relative to the overall length of the tapered coplanar stripline may be determined by a mathematical procedure (discussed in detail below), and optionally adjusted by empirical determination.

More specifically, in some embodiments of the piecewise tapered configurations illustrated in FIGS. 16 and 17, loss considerations may dictate the particular respective lengths and positions of each section in a piecewise configuration. For example, in one embodiment, to minimize the overall loss of the tapered configuration, each section could be placed at a given position z which would yield the minimum local loss at z, given the standing wave voltage and current amplitudes at that position.

However, since the standing wave amplitudes in the z-domain (i.e., V(z) and I(z)) are dependent upon the tapered coplanar stripline structure itself (and hence unknown before the construction of the stripline) the design and construction of a loss-optimized tapered stripline viewed from the persepective of the z-domain generally may be somewhat challenging, and require a time-consuming and perhaps costly iterative approach. In view of the foregoing, Applicants have recognized and appreciated that the design and construction of a tapered stripline configuration may be significantly facilitated by considering the design from the perspective of the θ-domain, where θ is the wave's phase.

In particular, as discussed in detail below, the standing wave voltage and current amplitudes in the θ-domain may be considered for practical purposes to be simple sinusoids (assuming weak loss); accordingly, applying a transformation from the z-domain to the θ-domain significantly simplifies the loss analysis for the design. After design of a piecewise tapered configuration in the θ-domain, an inverse transformation may be applied to render design parameters in the z-domain, which is necessary to obtain the actual dimensions (i.e., section lengths along the z-axis) for the physical layout of the tapered configuration. In the following discussion, this process is detailed step by step.

The overall time-averaged loss, $P_{diss}$, in a general tapered (position-dependent) coplanar stipline with a constant characteristic impedance, which hosts a single standing wave mode, is given by $$P_{diss} = \int_o^L \left\{ \frac{1}{2} R(z) I^2(z) + \frac{1}{2} G(z) V^2(z) \right\} dz \qquad (1)$$

where L is the horizontal span of the line, I(z) and V(z) are the current and voltage amplitudes of the standing wave mode at position z, and R(z) and G(z) are the series resistance and shunt conductance per unit length at z. In order to obtain the minimum-loss tapered line, one needs to find R(z) and G(z) that minimize $P_{diss}$ in Eq. (1) under the constraint of the R-G trade-off discussed above. However, it is very difficult to evaluate the integration in Eq. (1), since I(z) and V(z) are not known a priori, as they depend on the physical structure of the stripline, which has yet to be determined. Accordingly, the design process in the z-domain poses somewhat of a circular argument; in particular, a time-consuming iterative approach would be required, making the optimization procedure very involved and potentially costly.

According to one embodiment of the invention, evaluation of Eq. (1) becomes substantially simplified by a transformation in which the integration variable z is replaced by θ, the wave's phase. First, consider a piecewise tapered configuration having an infinitesimal number of uniform segments. Each uniform segment of the piecewise configuration has a length dz and the identical characteristic impedance $Z_o$. Traveling down the infinitesimal uniform line segment located between z and z+dz, a wave experiences an infinitesimal phase change of dθ, where dθ and dz are related through dθ=β(z)dz. Here β(z) is the propagation constant of the traveling wave in the infinitesimal uniform segment and is given by the familiar formula $$\beta(z) = \omega/v(z) = \omega\sqrt{L(z)C(z)}, \qquad (2)$$

where $v(z) = 1/\sqrt{L(z)C(z)}$ is the wave's phase velocity in the infinitesimal uniform line segment, L(z) and C(z) are inductance and capacitance per unit length in the infinitesimal uniform segment, and ω is the modal frequency. Substituting in the above relation β(z)=dθ/dz, we obtain the following relation between θ and z:

$$d\theta = \omega\sqrt{L(z)C(z)}dz, \text{ or} \qquad (3)$$

$$\theta(z) = \omega \int_0^z \sqrt{L(z')C(z')}dz' \qquad (4)$$

Again, in the case of a uniform line, θ(z) reduces to the familiar $\omega\sqrt{LC}z = \beta z$, where β is the phase constant, $2\pi/\lambda$.

But in a non-uniform line, the wave phase velocity $v(z)=1/\sqrt{L(z)C(z)}$ may vary with z, so $\theta(z)$ is not a linear function.

Mapping from z to $\theta(z)$ is useful because in any general transmission line with a constant characteristic impedance $Z_o$ the voltage and current amplitudes for a standing wave mode are always sinusoids of the phase $\theta(z)$, assuming weak loss. Accordingly, these amplitudes may be re-written as:

$$V(z)=V_0 \cos(\theta(z)) \quad (5)$$

$$I(z)=I_0 \sin(\theta(z)). \quad (6)$$

With the parameterization to $\theta$, the power dissipation equation from Eq. (1) may be re-written as $$P_{diss} = \int_0^{\pi/2} \left\{ \frac{1}{2}(I_0\sin\theta)^2 R_\theta(\theta) + \frac{1}{2}(V_0\cos\theta)^2 G(\theta) \right\} d\theta \quad (7)$$

assuming the line length is chosen so as to produce $\pi/2$ phase shift (for an essentially quarter-wavelength SWO). Here $R_\theta(\theta)$ and $G_\theta(\theta)$ are defined as series and shunt loss per radian phase shift at $\theta$, and are related to R(z) and G(z) by $$R_\theta(\theta)d\theta = R(z)dz \quad (8)$$

$$G_\theta(\theta)d\theta = G(z)dz \quad (9)$$

where the relationship between dz and d$\theta$ may be obtained from Eqs. (3) or (4). The integration in Eq. (7) is relatively easy since the current and voltage standing waveforms are always known sinusoids in the $\theta$-domain, irrespective of the particular tapered stripline configuration.

In view of the foregoing, a particular example of a piecewise configuration based on the concepts discussed above in connection with FIG. 17 may be used to illustrate an optimization process for a design using the z-domain to $\theta$-domain transformation, according to one embodiment of the invention. With reference again to the characteristic impedance contour shown in FIG. 17, loss parameters were simulated for five points along the contour (points 1–5), based on an exemplary characteristic impedance of $Z_o$=25 ohms. Table 2 below provides the results of this simulation, showing the relevant W-S dimensions of the stripline for each section as well as the corresponding loss parameters $R_\theta$ and $G_\theta$.

TABLE 2

| Point on $Z_o$ contour | W (μm) | S (μm) | $R_\theta$ (mΩ/deg) | $G_\theta$ (μS/deg) |
|---|---|---|---|---|
| 1 | 75 | 20 | 12.4 | 3.23 |
| 2 | 80 | 30 | 9.72 | 4.00 |
| 3 | 85 | 50 | 6.16 | 7.96 |
| 4 | 90 | 100 | 3.26 | 19.0 |
| 5 | 90 | 120 | 1.96 | 25.3 |

Once the loss parameters in the $\theta$-domain are obtained for each of the five sections, the amount of phase change that each section should contribute to minimize the overall loss of the tapered configuration may be determined. According to one embodiment, this can be done by evaluating, at each point in the $\theta$-domain (i.e., $0 \leq \theta \leq \pi/2$), which of the five sections minimizes the loss per unit phase shift at that local point. The loss per unit phase shift is the integrand of the loss integral in Eq. (7):

$$\frac{dP_{diss}}{d\theta} = \frac{1}{2}(I_0\sin\theta)^2 R_\theta(\theta) + \frac{1}{2}(V_0\cos\theta)^2 G_\theta(\theta). \quad (10)$$

With reference to FIG. 17, for purposes of illustrating the z-$\theta$ transformation, the z-axis is also labeled as the $\theta$-axis, and transition points $(\theta_1, z_1)$, $(\theta_2, z_2)$, $(\theta_3, z_3)$, and $(\theta_4, z_4)$ are indicated at the boundaries between the sections. The transition points $\theta_1, \theta_2, \theta_3$, and $\theta_4$ between the sections may be calculated with the aid of Eq. (10) by equating the loss per unit phase shift of one section to that of the next section. For example, $\theta_1$ can be calculated by $$\frac{1}{2}(I_0\sin\theta_1)^2 R_{\theta,1} + \frac{1}{2}(I_0 Z_0\cos\theta_1)^2 G_{\theta,1} =$$
$$\frac{1}{2}(I_0\sin\theta_1)^2 R_{\theta,2} + \frac{1}{2}(I_0 Z_0\cos\theta_1)^2 G_{\theta,2}$$

where $R_{\theta,1}$ and $R_{\theta,2}$ are the series resistance per unit phase shift for sections 1 and 2, respectively (from Table 2), while $G_{\theta,1}$ and $G_{\theta,2}$ are the shunt conductance per unit phase shift for sections 1 and 2, respectively (again from Table 2). This calculation yields $\theta_1$=22.9° for the particular example given in Table 2. Therefore, section 1 has lower loss per unit phase shift than section 2 for $\theta < \theta_1$=22.9° and section 2 has lower loss per unit phase shift than section 1 for $\theta > \theta_1$=22.9°. Thus, in one exemplary design, section 1 should span roughly the first 22.90 of the tapered stripline configuration, and at the 22.9° point, there should be a transition to section 2. The phase spans and corresponding transition points $\theta_2, \theta_3$, and $\theta_4$ of the other sections may be determined similarly; for example, applying Eq. (10) as above for $\theta_2$, $\theta_2$ is found to be 39.8°, so the phase span of section 2 is approximately 17° (i.e., $\theta_2-\theta_1$).

Having obtained the transition points between each section (and hence the span of each section) in the $\theta$-domain according to Eq. (10), these values are then transformed to the z-domain to yield the corresponding transition points $z_1, z_2, z_3$ and $z_4$ (see FIG. 17) and therefore the respective physical lengths of the different sections of the piecewise design. To this end, with reference to FIG. 17, the physical length of the i-th section (i=1, 2, 3, 4, 5) is given by $\Delta z_i = z_i - z_{i-1}$ in the z-domain, which corresponds to the phase span $\Delta \theta_i = \theta_i - \theta_{i-1}$ in the $\theta$-domain. Using Eq. (3) above, these two quantities are related by $$\Delta\theta_i = \omega\sqrt{L_i C_i}\Delta z_i \quad (11)$$

where $L_i$ and $C_i$ are the inductance and capacitance per unit length for the i-th section, and are known from the EM simulations. Accordingly, Eq. (11) may be used to determine the length of each section in the z-domain, completing the transformation of the design from the $\theta$-domain to the z-domain.

According to another aspect of this embodiment, as an optional further step in the process outlined above, once the physical length of each section is determined according to the above procedure the actual stripline layout near the transition points $z_1, z_2, z_3$ and $z_4$ may be smoothed so that the line further approximates or becomes an essentially continuous tapered configuration. The values of W and S thus become interpolations of the original selected points that were simulated. As mentioned above, it should be appreciated that the more points/sections one selects and simulates for the piecewise design, the better optimized these interpolated values become.

At this point, for SWO design using a tapered stripline, the piecewise tapered design may be schematically simulated to determine any adjustment that may be required in the design to account for the boundary condition associated with the amplifier 304 shown in FIG. 15A. The transistors of the amplifier effectively introduce additional phase shift to that of the coplanar stripline itself. Therefore, if the SWO is simulated using a coplanar stripline spanning a quarter of the wavelength corresponding to the target frequency, the actual oscillation frequency may be lower than this target.

Figure 17A:
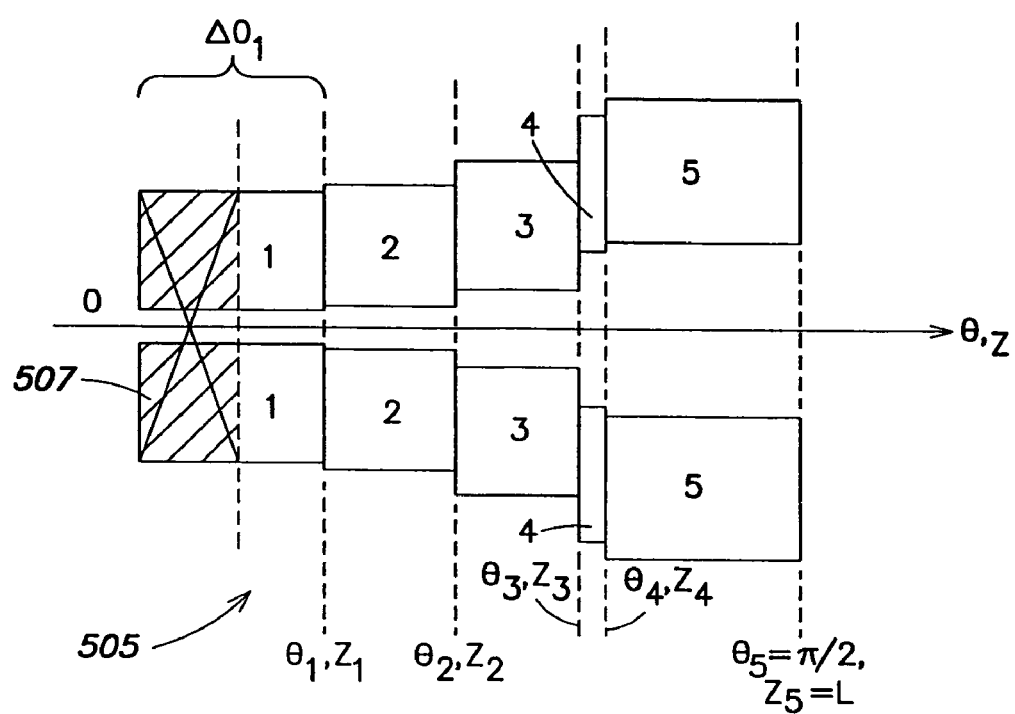
FIG. 17A illustrates the effects of transistor loading in the exemplary configuration of FIG. 17, according to one embodiment of the invention.

Accordingly, in one aspect of this embodiment, to compensate for the loading effects of the amplifier the stripline configuration may be shortened until the simulated oscillation frequency reaches the target frequency. For example, if the target oscillation frequency is 20 GHz, and if the simulated oscillation frequency does not reach 20 GHz until 15° worth of phase shift is removed from the stripline, then this 15° may be eliminated from the beginning of the line in the layout. In the particular example discussed above in connection with FIG. 17 and Table 2, the phase span parameter $\Delta\theta_i$ of section 1 may be shortened from 22.9° down to 7.9° to account for the effects of amplifier loading. This modification is illustrated in FIG. 17A, in which a portion 507 of section 1 indicated in shading and crossed-out with an "X" is removed from the stripline.

Figure 17B:
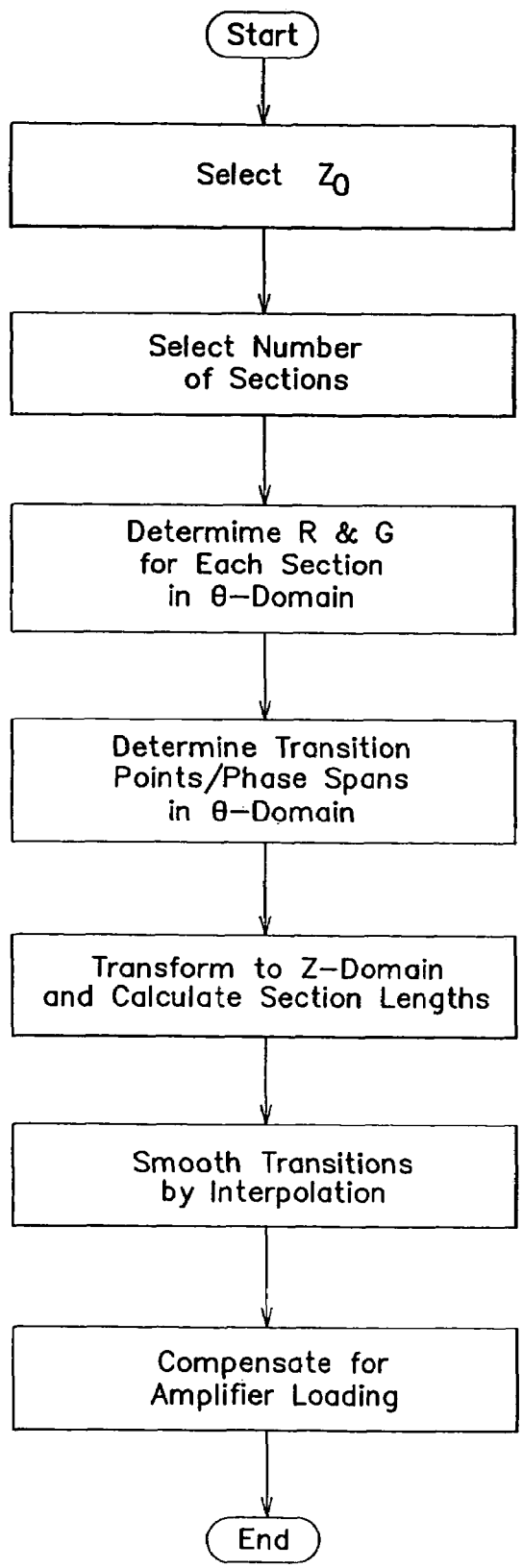
FIG. 17B illustrates a method flow diagram for the design of a piecewise tapered coplanar stripline configuration, according to one embodiment of the invention.

In sum, it should be appreciated that a design procedure for a piecewise tapered coplanar stripline configuration according to one embodiment of the invention, as outlined above in connection with the specific examples given in FIG. 17 and Table 2, is provided primarily for purposes of illustration, and that the disclosure is not limited to this example. In particular, the salient concepts underlying this design procedure may be generally specified as follows, with reference to the method flow diagram illustrated in FIG. 17B: 1) select a characteristic impedance $Z_o$ for the piecewise tapered configuration; 2) select the number of sections to be included in the piecewise tapered configuration (i.e., select the number of points in a graph of contours similar to those shown in FIGS. 16 and 17); 3) for each section, determine in the θ-domain the loss parameters $R_\theta$ and $G_\theta$ based on Eqs. (8) and (9); 4) determine in the θ-domain the transition points between sections based on Eq. (10); and 5) transform the transition points (or phase spans) in the θ-domain to the z-domain, based on Eq. (11), to determine the respective physical lengths of the different sections. As an optional additional step, once the physical length of each section is determined, the transition points may be smoothed via interpolation of the width W and spacing S. As a further option, for SWO designs based on piecewise tapered configurations, amplifier loading effects may be compensated by shortening the overall length of the stripline (e.g., as illustrated in FIG. 17A).

It should be appreciated that although the exemplary tapered coplanar stripline configurations illustrated in FIGS. 15A, 16, 17 and 17A are based on an essentially (λ/4) coplanar stripline SWO, the invention is not limited in this respect. In particular, tapered transmission line configurations having a variety of dimensional profiles may be implemented for different types of devices in which different R and/or G values may be desirable at different points along the device. In general, tapered transmission line configurations according to various embodiments of the invention may be designed to have arbitrary values of R and/or G as a function of position z along the transmission line for a variety of applications.

f (λ/4) Coplanar Stripline SWO with Q-enhancement and Phase Velocity Reduction Features FIGS. 18A, 18B and 18C illustrate photographs of three different (λ/4) coplanar stripline standing wave oscillator designs according to various embodiments of the present invention. In particular, FIG. 18A shows a top view of a circuit die of a uniform coplanar stripline SWO 510 (based at least in part on the embodiment shown in FIG. 13A), whereas FIGS. 18B and 18C show respective top views of circuit dies of different tapered coplanar stripline SWOs 512 and 514 (based at least in part on the embodiment shown in FIG. 15A). In each of these (λ/4) coplanar stripline SWOs, the short 302 between the conductors of the stripline at the position z=L is illustrated in the top portion of the figures, whereas connection points 516 at the position z=0 for one or more amplifiers (similar to the amplifiers 304 shown in FIGS. 13A and 15A) are indicated in the bottom portion of the figures.

Each of the SWOs shown in FIGS. 18A, 18B and 18C was fabricated using a 0.18 micrometer CMOS technology, and in cross-section each of the SWOs also includes one or more arrays 62 of conductive strips, similar to those discussed above in connection with FIGS. 5A, 5B, 8, 10 and 11 (in FIGS. 18A, 18B and 18C, which are top views, the arrays 62 are indicated generally as a shaded area underneath the conductors of the is coplanar striplines). As discussed above in connection with these earlier figures, in one aspect of these embodiments, the presence of the array(s) of conductive strips facilitate both Q-enhancement and phase velocity reduction in the SWOs. In another aspect, loss reduction realized by the tapered configurations of FIGS. 18B and 18C contributes to further Q-enhancement in these embodiments.

In each of the SWOs shown in FIGS. 18A, 18B and 18C, the significant conductor mass at the short 302 tends to increase series resistance at a point in the structure where a relatively lower R is desirable. Accordingly, in one embodiment, each of the SWOs may further include a conductive metal plate 63 on a same plane as one or more of the arrays 62 (e.g., underneath the short 302, as indicated by the solid white area in the figure), wherein the short 302 is connected to the plate 63 by a number of vias. This arrangement essentially augments the mass of the conductor in the area of the short 302 and thereby reduces the series resistance in this area.

In the tapered embodiment of FIG. 18B, the greater conductor separation at z=L as compared to the uniform embodiment of FIG. 18A results in a proportionally longer short 302. This longer short 302 also may tend to increase series resistance relative to the structure shown in FIG. 18A, thereby potentially undermining in part the benefits of the tapered configuration. In view of the foregoing, the embodiment of FIG. 18C offers an alternative tapered configuration, in which the taper of the stripline conductors is modified such that the length of the short 302 is similar to that of the uniform configuration shown in FIG. 18A.

To comparatively measure the performance of the uniform and tapered configurations, the SWOs illustrated in FIGS. 18A, 18B and 18C were fabricated to each have a characteristic impedance $Z_o$ of approximately 25 ohms for operation at approximately 15 GHz. Each of the devices has an overall stripline length L of approximately 420 micrometers. For the uniform embodiment of FIG. 18A, the width of each conductor of the stripline is approximately 85 micrometers and the spacing between the conductors is approximately 50 micrometers. For the tapered configuration of FIG. 18B, conductor width ranged from approximately 75 micrometers near z=0 to approximately 90 micrometers near z=L, and the spacing between conductors ranged from approximately 20 micrometers at z=0 to approximately 120 micrometers at z=L (e.g., see Table 2). Experimental measurements confirmed that a Q-enhancement of approximately 50% was realized in the tapered device of FIG. 18B relative to the uniform device of FIG. 18A (e.g., the uniform device had a quality factor Q of approximately 39, whereas the tapered device had a Q of approximately 59).

g. Low Loss Frequency Tunable Standing Wave Oscillators

In yet another embodiment of the present invention, a coplanar stripline implementation of an SWO may be configured with frequency adjustability that may be again optimized to reduce loss and hence power consumption. For example, according to one embodiment, an SWO is implemented with one or more variable capacitors ("varactors") that vary the capacitance per unit length C of the coplanar stripline, and hence vary the frequency of oscillation (phase velocity v, which relates frequency and wavelength, is inversely proportional to the square root of the product LC). In one aspect of this embodiment, the placement of one or more varactors on the coplanar stripline is optimized to maintain appreciable frequency adjustability while reducing any losses incurred by the varactor(s).

Figure 19A:
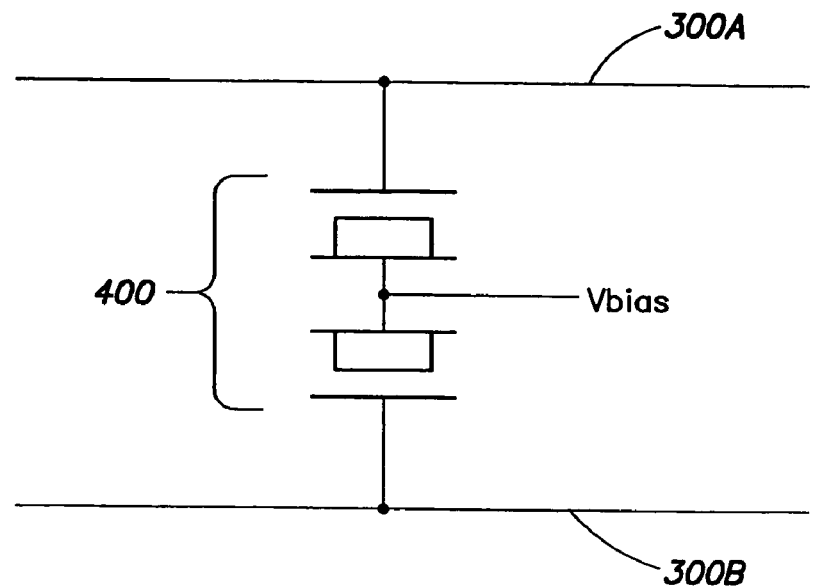
FIGS. 19A and 19B illustrate different representations of frequency adjustability components for a standing wave oscillator, according to one embodiment of the invention.
Figure 19B:
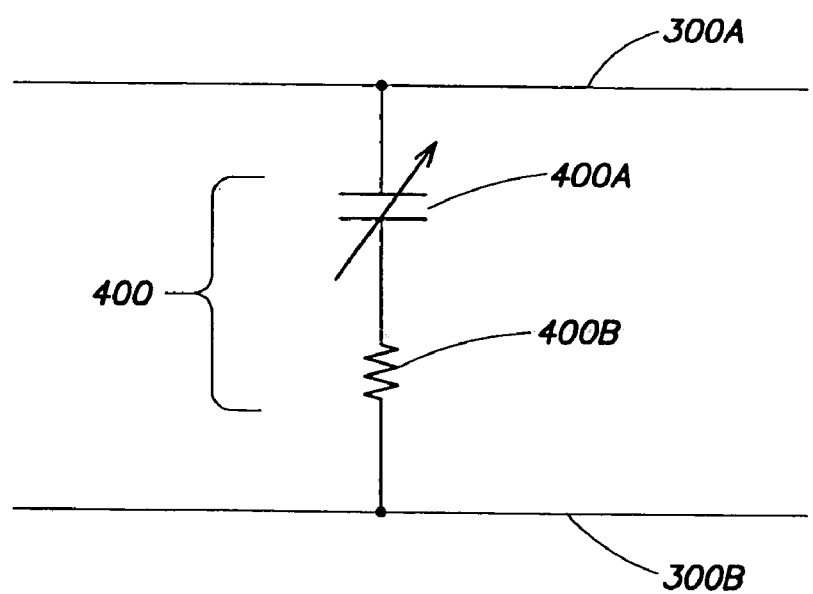

FIGS. 19A and 19B show different representations of a varactor that may be employed with an SWO according to one embodiment of the invention. In particular, FIG. 19A shows a varactor 400 connected between two conductors 300A and 300B of a coplanar stripline, wherein the varactor is implemented as a pair of NMOS transistors having their gates coupled to respective conductors of the coplanar stripline, and having their sources and drains coupled together and connected to a bias voltage Vbias. FIG. 19B shows another equivalent schematic representation of the varactor 400, wherein a variable capacitance 400A is shown series-connected to a resistance 400B, representing the inherent loss associated with the varactor 400.

With reference again to FIGS. 13A and 13B illustrating an exemplary ($\lambda/4$) coplanar stripline SWO, it should be appreciated that implementing one or more varactors 400 in a SWO according to various embodiments of the invention may affect power consumption due to losses associated with the varactor resistance 400B. In particular, if a varactor is positioned in an SWO at a point of maximum voltage amplitude swing (e.g., z=0 in FIG. 13A), the frequency adjustability is significant, but also losses due to a relatively high voltage across the varactor resistance may be appreciable. On the other hand, placing a varactor close to the shorted end of the SWO (e.g., z=L in FIG. 13A) would result in low losses due to little or no voltage across the varactor resistance, but also little or no frequency tuning ability.

However, Applicants have recognized and appreciated that, in connection with at least some fabrication processes, while loss due to the varactor resistance decreases essentially linearly moving from a point of maximum voltage amplitude (i.e., z=0) to a voltage node (i.e., z=L), the same is not true of frequency tuning ability; namely, frequency tuning ability based on varactor position remains essentially constant from a point of maximum voltage amplitude up to approximately halfway toward a voltage node (i.e., $0<z\leq L/2$). After the halfway point ($L/2<z\leq L$), frequency tuning ability begins to noticeably drop off as the voltage node is approached, at which point there is no frequency tuning ability. Hence, in some processes, while it has been noted that there is an essentially linear relationship between varactor position along the resonator and loss due to varactor resistance, there is also a significantly non-linear relationship between varactor position along the resonator and frequency tuning ability.

In view of the foregoing, according to one embodiment of the invention, this phenomenon is exploited in a coplanar stripline SWO by positioning a varactor in proximity of a halfway point (e.g., z≈L/2 in FIG. 13A) between a maximum voltage amplitude and a voltage node (zero volts). In one aspect of this embodiment, the varactor position may be optimized by placing the varactor in proximity of the halfway point but between the halfway point and the voltage node (e.g., $L/2<z<<L$ in FIG. 13A). In this manner, significant frequency tuning ability is maintained while significantly reducing losses attributed to the varactor resistance. In various implementations, a varactor as described above may be employed in connection with uniform or non-uniform (e.g., tapered) coplanar stripline configurations, as well as SWO configurations other than the ($\lambda/4$) coplanar stripline SWOs discussed herein. In yet other embodiments, a distribution of varactors along the coplanar stripline can be used to provide frequency tunability while mitigating any potential effects relating to losses due to lumped varactor loading.

h. Closed Loop Standing Wave Oscillators

Another embodiment of the invention is directed to a closed loop (e.g., circular) standing wave oscillator based on a ring resonator coplanar stripline implementation. In one aspect of this embodiment, as discussed in greater detail below, a cross-coupled amplifier configuration is employed to facilitate single mode operation, using a particular resonator topology so as to avoid inducing significant loss in the oscillator.

Figure 20A:
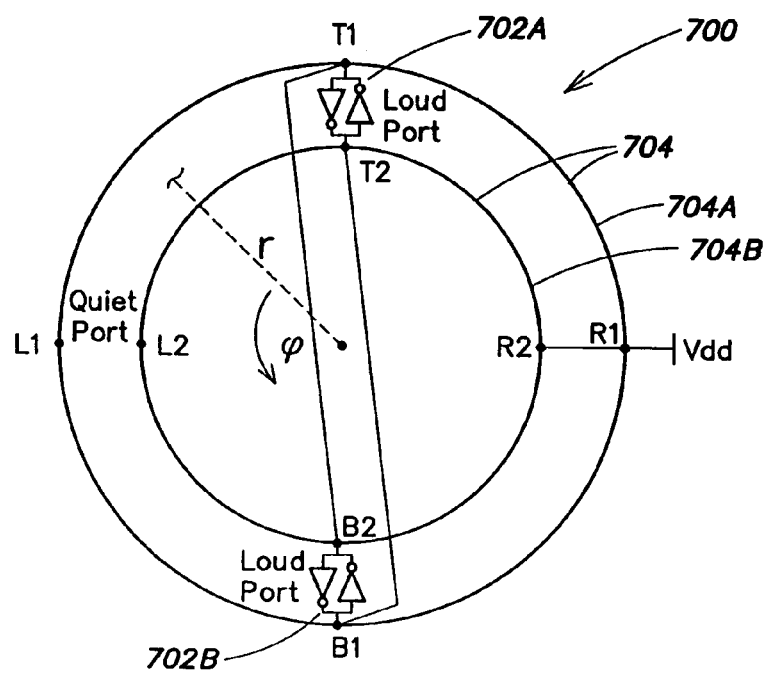
FIGS. 20A and 20B illustrate examples of a closed loop standing wave oscillator, according to one embodiment of the invention.

More specifically, FIG. 20A illustrates a closed-loop SWO 700 according to one embodiment of the present invention, schematically represented as a circular loop. The SWO 700 employs at least two amplifiers 702A and 702B (i.e., two pairs of cross-coupled inverters) which counterbalance loss in the circuit, and a closed loop coplanar stripline 704 (including conductors 704A and 704B) having an overall path length L on which standing waves are formed to meet the boundary condition $V(\phi)=V(\phi+2\pi)$, where $\phi$ is an arbitrary reference angle from a given reference radius r of the ring structure. The boundary condition results in possible energy modes at $L=2\pi r=n\lambda$ (for n=1, 2, 3 ... ), where r is the radius of the ring. The fundamental frequency of oscillation $f_o$ corresponding to n=1 then is given by v/L, where v is the phase velocity.

The interconnection of the amplifiers 702A and 702B of the SWO 700 shown in FIG. 20A effectively implements a mode control technique for the oscillator. In particular, by connecting point T1 to point B2 and point T2 to point B1, the ports T1–T2 and B1–B2 are ensured to be in opposite phase (180°), thereby suppressing all even mode harmonics. This even node suppression makes port L1–L2 always remain "quiet," i.e., a zero voltage node. Port R1–R2 is forced also to be a zero voltage node by tapping the power supply for the amplifiers into this port as a common mode voltage.

Figure 20B:
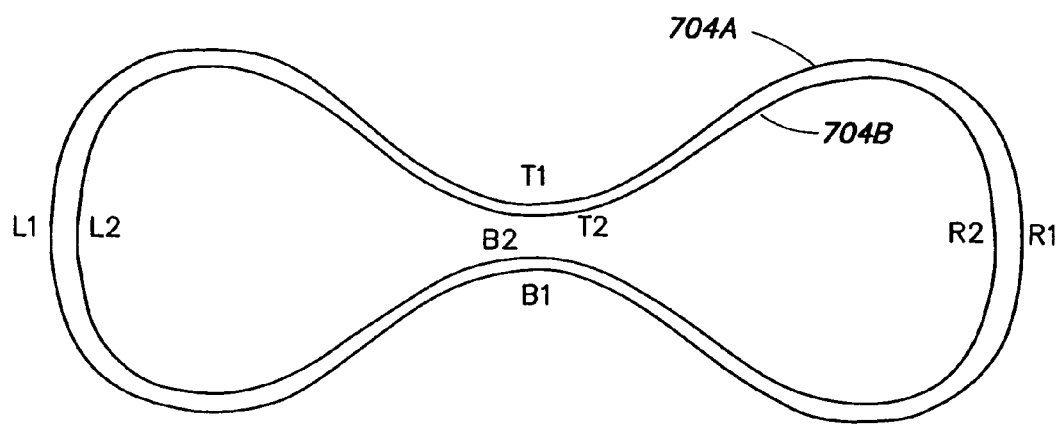
Figure 21:
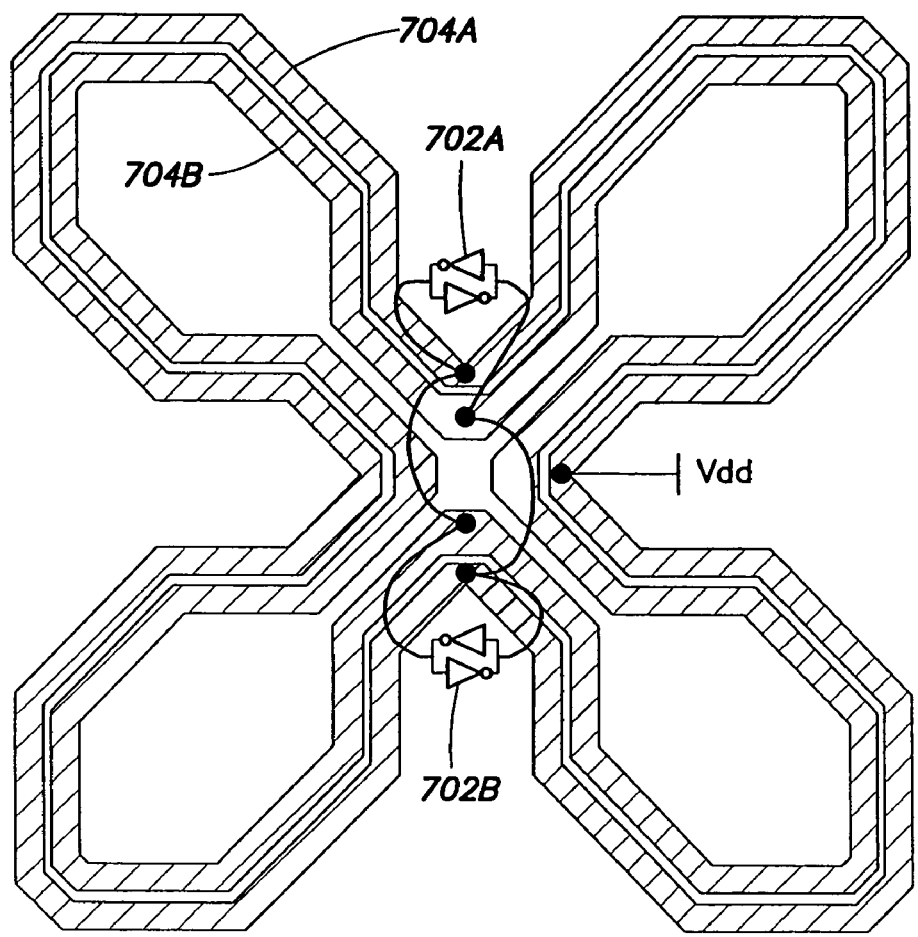
FIG. 21 illustrates an example of a closed loop standing wave oscillator, according to another embodiment of the invention.

FIG. 20B illustrates one example of a physical layout for the ring resonator schematically represented in FIG. 20A. In the layout of FIG. 20B, the interconnections between the amplifiers 702A and 702B for implementing the even mode suppression are positioned proximate each other so as to introduce negligible time delay as compared to the intentional delay in the ring coplanar stripline. In particular, the shape of the ring coplanar stripline is distorted, while otherwise keeping its topology in tact, so that port T1–T2 and port B1–B2 are physically close to each other to reduce interconnection loss between the ports. FIG. 21 illustrates yet another layout for a closed loop SWO pursuant to the concept of FIG. 20B, in the shape of a "clover leaf" such that the amplifiers 702A and 702B are again positioned proximate each other. In one aspect of the embodiment shown in FIG. 21, four $\lambda/4$ sections of the coplanar stripline are coupled together to form the complete loop.

Figure 22A:
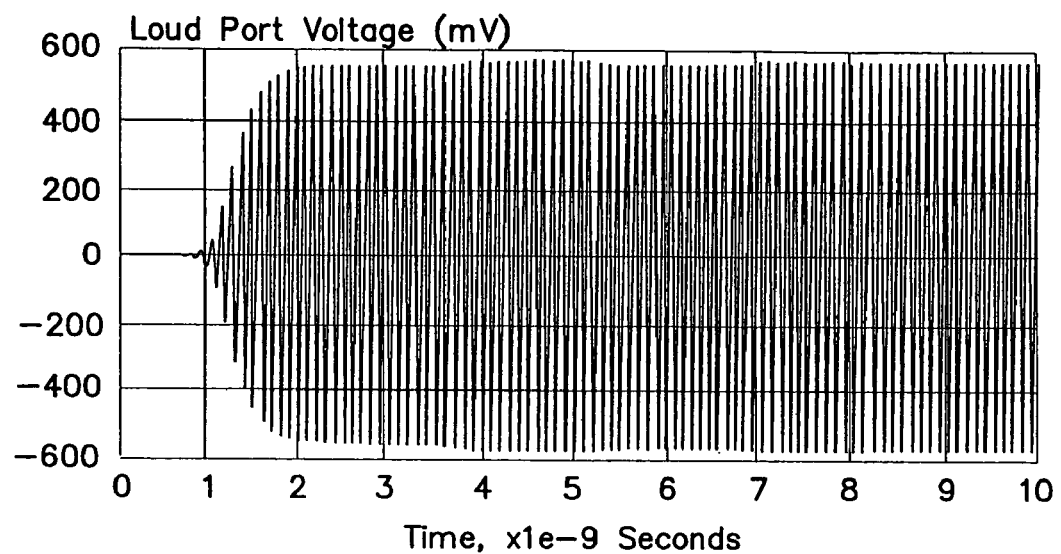
FIGS. 22A and 22B illustrate exemplary signals resulting from a simulation of the closed loop standing wave oscillator of FIG. 21.
Figure 22B:
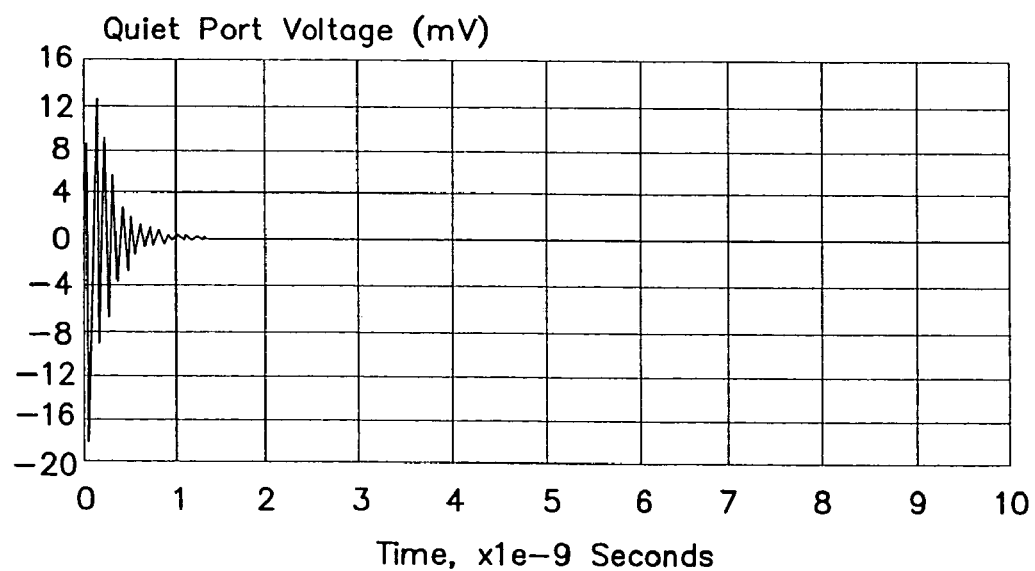

FIGS. 22A and 22B illustrate simulation results for a 10 GHz closed loop SWO implemented using a Silicon-Germanium (Si—Ge) process with transistors whose $f_T$ is approximately 50 GHz. As illustrated in FIG. 22A, each of the "loud ports" (e.g., T1–T2 and B1–B2 in FIG. 20A) has a differential voltage swing of 1.2 Volts when the oscillator draws approximately 5 mA of DC current from a 1.5V power supply. As shown in FIG. 22B, after some initial ringing, the "quiet port" (e.g., L1–L2 in FIG. 20A) stays quiet, as expected.

According to various aspects of this embodiment, a number of concepts discussed above in connection with quarter-wavelength SWO implementations also may be employed to realize a variety of closed loop coplanar stripline SWO configurations. For example, in various aspects of this embodiment, one or both of a tailored distributed amplification scheme and a variable parameter coplanar stripline configuration (e.g., tapered coplanar stripline) may be employed with the closed loop structure. In other aspects, one or both of a tapered coplanar stripline configuration (i.e., with position dependent R and G) and array(s) of conductive strips may be employed to facilitate Q-enhancement and phase velocity reduction. In yet another aspect, low loss frequency tuning capability may be implemented in such an SWO using one or more appropriately positioned varactors.

III. Conclusion

Having thus described several illustrative embodiments, it is to be appreciated that various alterations, modifications, and improvements will readily occur to those skilled in the art. Such alterations, modifications, and improvements are intended to be part of this disclosure, and are intended to be within the spirit and scope of this disclosure. While some examples presented herein involve specific combinations of functions or structural elements, it should be understood that those functions and elements may be combined in other ways according to the present invention to accomplish the same or different objectives. In particular, acts, elements, and features discussed in connection with one embodiment are not intended to be excluded from similar or other roles in other embodiments. Accordingly, the foregoing description and attached drawings are by way of example only, and are not intended to be limiting.

What is claimed is:

1. A coplanar stripline, comprising:
a first conductor and a second conductor,
wherein the coplanar stripline is configured to have a resistance per unit length R and a conductance per unit length C that vary along a length of the coplanar stripline, and
wherein the coplanar stripline is configured to have a substantially uniform characteristic impedance along the length of the coplanar stripline.

2. A standing wave oscillator to generate at least one voltage standing wave having a frequency $f_o$, the oscillator comprising:
the coplanar stripline of claim 1 including the two first and second conductors and having a length L equal to or approximately equal to a quarter-wavelength ($\lambda/4$), wherein $\lambda$ is related to the frequency $f_o$ by a phase velocity of waves constituting the at least one voltage standing wave; and
at least one amplifier disposed between the conductors at a first end of the coplanar stripline,
wherein the two conductors are connected together at a second end of the coplanar stripline to form a short circuit.

3. The oscillator of claim 2, wherein the at least one amplifier includes at least one pair of cross-coupled inverters.

4. The oscillator of claim 2, wherein the at least one amplifier includes means for distributing a gain of the at least one amplifier in a varying manner along the length of the coplanar stripline.

5. The oscillator of claim 2, further comprising means for controlling an oscillation mode of the oscillator.

6. The oscillator of claim 2, wherein the at least one amplifier includes a plurality of amplifiers disposed along the length of the coplanar stripline.

7. The oscillator of claim 6, wherein the plurality of amplifiers includes at least two amplifiers configured to have different gains.

8. The oscillator of claim 7, wherein each amplifier of the plurality of amplifiers is configured to have a different gain than another amplifier of the plurality of amplifiers.

9. The oscillator of claim 7, wherein respective gains of the plurality of amplifiers are configured to be related to an amplitude of the at least one voltage standing wave.

10. The oscillator of claim 9, wherein a gain of each amplifier of the plurality of amplifiers relates to the amplitude of the at least one voltage standing wave at a position at which the amplifier is disposed along the coplanar stripline.

11. The oscillator of claim 6, wherein the plurality of amplifiers are substantially equally spaced along the length of the coplanar stripline.

12. The oscillator of claim 11, wherein each amplifier of the plurality of amplifiers is configured to have a different gain than another amplifier of the plurality of amplifiers.

13. The oscillator of claim 11, wherein respective gains of the plurality of amplifiers are configured to be related to an amplitude of the at least one voltage standing wave.

14. The oscillator of claim 13, wherein again of each amplifier of the plurality of amplifiers relates to the amplitude of the at least one voltage standing wave at a position at which the amplifier is disposed along the coplanar stripline.

15. The oscillator of claim 2, wherein the coplanar stripline is configured as a plurality of sections, wherein each section of the plurality of sections has a different resistance per unit length R and a different conductance per unit length G.

16. The oscillator of claim 2, wherein the coplanar stripline is configured such that the resistance per unit length R and the conductance per unit length G vary substantially continuously along the length of the coplanar stripline.

17. The oscillator of claim 2, wherein a space between the two conductors and a width of the conductors is varied along the length of the coplanar stripline.

18. The oscillator of claim 2, wherein the coplanar stripline is configured such that the conductance per unit length G is smaller at the first end of the coplanar stripline than at the second end of the coplanar stripline, and such that the resistance per unit length R is smaller at the second end of the coplanar stripline than at the first end of the coplanar stripline.

19. The oscillator of claim 18, wherein the at least one amplifier includes a plurality of amplifiers disposed along the length of the coplanar stripline.

20. The oscillator of claim 19, wherein respective gains of the plurality of amplifiers are configured to be related to an amplitude of the at least one voltage standing wave.

21. The oscillator of claim 20, wherein a gain of each amplifier of the plurality of amplifiers relates to the amplitude of the at least one voltage standing wave at a position at which the amplifier is disposed along the coplanar stripline.

22. The oscillator of claim 21, wherein the plurality of amplifiers are equally spaced along the length of the coplanar stripline.

23. The oscillator of claim 2, wherein the two conductors include a first conductor and a second conductor essentially parallel to each other and oriented substantially along a first direction, and wherein the oscillator further includes:
   a plurality of essentially linear conductive strips disposed in proximity to the coplanar stripline, the plurality of linear conductive strips being essentially parallel to each other and oriented substantially along a second direction transverse to the first direction.

24. The oscillator of claim 2, further including at least one frequency adjustment component to adjust the frequency $f_o$ of the at least one voltage standing wave.

25. The oscillator of claim 24, wherein the at least one frequency adjustment component includes at least one varactor disposed approximately at a midpoint between the first end and the second end of the coplanar stripline.

26. The oscillator of claim 25, wherein the at least one varactor is disposed between the midpoint and the second end of the coplanar stripline.

27. A standing wave oscillator to generate at least one voltage standing wave, comprising:
   the coplanar stripline of claim 1, configured as a closed-loop coplanar stripline including the two first and second conductors; and
   at least one amplifier disposed between the two conductors at a first location,
   wherein the two conductors are connected together at a second location different from the first location to provide a zero voltage node for the at least one voltage standing wave.

28. The oscillator of claim 27, wherein the at least one amplifier includes means for distributing a gain of the at least one amplifier in a varying manner along the coplanar stripline.

29. The oscillator of claim 27, further comprising means for controlling an oscillation mode of the oscillator.

30. The oscillator of claim 27, further comprising means for controlling an oscillation frequency of the oscillator.

31. The oscillator of claim 27, wherein the at least one amplifier includes at least a first amplifier located at the first location, the first location being one-quarter a distance around the closed loop coplanar stripline in a first direction from the second location, and a second amplifier located at a third location one-quarter the distance around the closed loop coplanar stripline in a second direction from the second location, such that the first and second amplifiers are opposite each other in the closed loop coplanar stripline.

32. The oscillator of claim 31, wherein:
   a first conductor of the two conductors at the first location is connected to a second conductor of the two conductors at the third location; and
   the second conductor at the first location is connected to the first conductor at the third location.

33. The oscillator of claim 32, wherein the closed-loop coplanar stripline is shaped such that the first location is physically proximate to the third location.

34. The coplanar stripline of claim 1, wherein the coplanar stripline is configured as a plurality of sections, wherein each section of the plurality of sections has a different resistance per unit length R and a different conductance per unit length G.

35. The coplanar stripline of claim 1, wherein the coplanar stripline is configured such that the resistance per unit length R and the conductance per unit length G vary substantially continuously along the length of the coplanar stripline.

36. The coplanar stripline of claim 1, wherein a space between the first and second conductors and a width of the conductors is varied along the length of the coplanar stripline.

37. A method for generating at least one voltage standing wave on the coplanar stripline of claim 1, comprising an act of:
   A) distributing amplification in a varying manner along the coplanar stripline so as to overcome coplanar stripline loss.

38. The method of claim 37, wherein the act A) comprises an act of:
   distributing the amplification along the coplanar stripline such that the distributed amplification is related to an amplitude of the at least one voltage standing wave.

39. The method of claim 37, wherein the act A) comprises an act of:
   B) disposing a plurality of amplifiers along the coplanar stripline, at least two amplifiers of the plurality of amplifiers having different gains.

40. The method of claim 39, wherein a gain of each amplifier of the plurality of amplifiers relates to an amplitude of the at least one voltage standing wave at a position at which the amplifier is disposed along the coplanar stripline.

41. The method of claim 40, wherein the act B) comprises an act of:
   equally spacing the plurality of amplifiers along the length of the coplanar stripline.

42. A method for generating at least one voltage standing wave on a the coplanar stripline of claim 1, comprising an act of:
   A) controlling an oscillation mode of the at least one voltage standing wave.

43. The method of claim 42, wherein the act A) comprises an act of:
   B) positioning at least one amplifier along the coplanar stripline so as to excite at least one desired oscillation mode of the at least one voltage standing wave.

44. The method of claim 43, wherein the act B) comprises an act of:
   positioning a plurality of amplifiers at different locations along the coplanar stripline so as to excite the at least one desired oscillation mode of the at least one voltage standing wave.

45. The method of claim 42, wherein the act A) comprises an act of:

distributing amplification along the coplanar stripline such that the distributed amplification is related to an amplitude of a desired oscillation mode of the at least one voltage standing wave.

46. A method for controlling a frequency of at least one voltage standing wave on the coplanar stripline of claim 1, comprising an act of:
- A) placing at least one frequency control device along the coplanar stripline at a position that is approximately at a midpoint between a maximum amplitude of the at least one voltage standing wave and a zero voltage node of the at least one voltage standing wave.

47. The method of claim 46, wherein the act A) comprises an act of:
- B) placing the at least one frequency control device along the coplanar stripline at a position that is between the midpoint and the zero voltage node.

48. The method of claim 47, wherein the act B) comprises an act of:
- placing the at least one frequency control device closer to the midpoint than to the zero voltage node.

* * * * *

UNITED STATES PATENT AND TRADEMARK OFFICE
CERTIFICATE OF CORRECTION

| | | |
|---|---|---|
| PATENT NO. | : 7,091,802 B2 | Page 1 of 1 |
| APPLICATION NO. | : 10/894674 | |
| DATED | : August 15, 2006 | |
| INVENTOR(S) | : Donhee Ham et al. | |

It is certified that error appears in the above-identified patent and that said Letters Patent is hereby corrected as shown below:

Col. 37, line 60 should read
--1.    A coplanar stripline, comprising:
        a first conductor and a second conductor,
        wherein the coplanar stripline is configured to have a resistance per unit length $R$ and a conductance per unit length $G$ that vary along a length of the coplanar stripline, and
        wherein the coplanar stripline is configured to have a substantially uniform characteristic impedance along the length of the coplanar stripline.--

Signed and Sealed this

Twenty-first Day of November, 2006

JON W. DUDAS
*Director of the United States Patent and Trademark Office*